(12) United States Patent
Beach et al.

(10) Patent No.: US 10,096,702 B2
(45) Date of Patent: Oct. 9, 2018

(54) MULTI-STEP SURFACE PASSIVATION STRUCTURES AND METHODS FOR FABRICATING SAME

(71) Applicant: Efficient Power Conversion Corporation, El Segundo, CA (US)

(72) Inventors: Robert Beach, La Crescenta, CA (US); Robert Strittmatter, Tujunga, CA (US); Chunhua Zhou, Torrance, CA (US); Guangyuan Zhao, Torrance, CA (US); Jianjun Cao, Torrance, CA (US)

(73) Assignee: Efficient Power Conversion Corporation, El Segundo, CA (US)

( * ) Notice: Subject to any disclaimer, the term of this patent is extended or adjusted under 35 U.S.C. 154(b) by 0 days.

(21) Appl. No.: 15/609,081

(22) Filed: May 31, 2017

(65) Prior Publication Data

US 2017/0352754 A1 Dec. 7, 2017

Related U.S. Application Data

(60) Provisional application No. 62/468,151, filed on Mar. 7, 2017, provisional application No. 62/344,151, filed on Jun. 1, 2016.

(51) Int. Cl.
*H01L 29/778* (2006.01)
*H01L 29/40* (2006.01)
(Continued)

(52) U.S. Cl.
CPC ...... *H01L 29/7787* (2013.01); *H01L 29/2003* (2013.01); *H01L 29/205* (2013.01);
(Continued)

(58) Field of Classification Search
CPC ............. H01L 29/7787; H01L 29/7786; H01L 29/42376
See application file for complete search history.

(56) References Cited

U.S. PATENT DOCUMENTS

| 8,076,698 B2 | 12/2011 | Ueda et al. |
| 8,350,294 B2 | 1/2013 | Lidow et al. |
(Continued)

FOREIGN PATENT DOCUMENTS

| CN | 104299999 A | 1/2015 |
| TW | 201511261 A | 3/2015 |
| TW | 201546992 A | 12/2015 |

OTHER PUBLICATIONS

B. Green et al., "The Effect of Surface Passivation on the Microwave Characteristics of Undoped AlGaN/GaN HEMT's," IEEE Electron Device Letters, vol. 21, No. 6, Jun. 2000, pp. 268-270.
(Continued)

*Primary Examiner* — Thomas L Dickey
(74) *Attorney, Agent, or Firm* — Blank Rome LLP

(57) ABSTRACT

A gallium nitride (GaN) transistor which includes two or more insulator semiconductor interface regions (insulators). A first insulator disposed between the gate and drain (near the gate) minimizes the gate leakage and fields near the gate that cause high gate-drain charge ($Q_{gd}$). A second insulator (or multiple insulators), disposed between the first insulator and the drain, minimizes electric fields at the drain contact and provides a high density of charge in the channel for low on-resistance.

24 Claims, 39 Drawing Sheets

(51) Int. Cl.
*H01L 29/20* (2006.01)
*H01L 29/51* (2006.01)
*H01L 29/205* (2006.01)
*H01L 29/66* (2006.01)

(52) U.S. Cl.
CPC .......... *H01L 29/402* (2013.01); *H01L 29/513* (2013.01); *H01L 29/66462* (2013.01)

(56) References Cited

U.S. PATENT DOCUMENTS

| | | | |
|---|---|---|---|
| 2006/0145189 A1* | 7/2006 | Beach | H01L 29/405 257/192 |
| 2009/0224288 A1 | 9/2009 | Parikh et al. | |
| 2010/0258848 A1* | 10/2010 | Lidow | H01L 29/66522 257/288 |
| 2013/0234153 A1 | 9/2013 | Lidow et al. | |
| 2013/0240911 A1 | 9/2013 | Beach | |
| 2015/0155358 A1 | 6/2015 | Briere | |

OTHER PUBLICATIONS

K. Enisherlova et al., "Study of the effect of passivation layers on capacitance of AlGaN/GaN heterostructures," Modern Electronic Materials 2 (2016), pp. 131-137.

S.J. Kim et al., "Reduction of the Gate Leakage Current in Binary-Trench-Insulated Gate AlGaN/GaN High-Electron-Mobility Transistors," Journal of the Korean Physical Society, vol. 55, No. 1, pp. 356-361, Jul. 2009.

* cited by examiner

Deposit metal and etch to form ohmic contacts and field plate

Embodiment 3 process is the same except deposit offset layer before Insulator 2.

Offset layer

2DEG density increases under ILD1 to ILD2 to ILD3, ....

MULTI-STEP SURFACE PASSIVATION STRUCTURES AND METHODS FOR FABRICATING SAME

CROSS REFERENCE TO RELATED APPLICATIONS

This application claims priority from U.S. Provisional Application No. 62/344,151, filed on Jun. 1, 2016, and U.S. Provisional Application No. 62/468,151, filed on Mar. 7, 2017, the disclosures of which are hereby incorporated herein by reference in their entireties.

FIELD OF THE INVENTION

The present invention relates to the field of column III nitride transistors such as gallium nitride (GaN) transistors. More particularly, the invention relates to GaN transistors with multiple insulator semiconductor interface regions.

BACKGROUND OF THE INVENTION

Gallium nitride (GaN) semiconductor devices are increasingly desirable for power semiconductor devices because of their ability to carry large current and support high voltages. Development of these devices has generally been aimed at high power/high frequency applications. Devices fabricated for these types of applications are based on general device structures that exhibit high electron mobility and are referred to variously as heterojunction field effect transistors (HFET), high electron mobility transistors (HEMT), or modulation doped field effect transistors (MODFET).

A GaN HEMT device includes a nitride semiconductor with at least two nitride layers. Different materials formed on the semiconductor or on a buffer layer cause the layers to have different band gaps. The different material in the adjacent nitride layers also causes polarization, which contributes to a conductive two-dimensional electron gas (2DEG) region near the junction of the two layers, specifically in the layer with the narrower band gap.

The nitride layers that cause polarization typically include a barrier layer of AlGaN adjacent to a layer of GaN to include the 2DEG, which allows charge to flow through the device. This barrier layer may be doped or undoped. Because the 2DEG region exists under the gate at zero gate bias, most nitride devices are normally on, or depletion mode devices. If the 2DEG region is depleted, i.e. removed, below the gate at zero applied gate bias, the device can be an enhancement mode device. Enhancement mode devices are normally off and are desirable because of the added safety they provide and because they are easier to control with simple, low cost drive circuits. An enhancement mode device requires a positive bias applied at the gate in order to conduct current.

FIG. 1 illustrates a cross-sectional view of a conventional enhancement mode GaN transistor 100 with a single layer of a surface passivating insulator (layer) 108, and is more fully described in U.S. Pat. No. 8,076,698, issued to Ueda et al. Device 100 of FIG. 1 includes substrate 101 that can be composed of silicon (Si), silicon carbide (SiC), sapphire, or other material, transition layers 102 composed of AlN and AlGaN that is about 0.1 to about 1.0 µm in thickness, buffer material 103 composed of GaN that is about 0.5 to about 10 µm in thickness, barrier material 104 composed of AlGaN where the Al to Ga ratio is about 0.1 to about 0.5 with thickness from about 0.005 to about 0.03 µm, low-doped p-type AlGaN 105, heavily doped p-type GaN 106, isolation region 107, passivation layer/region 108, ohmic contact metals 109 and 110 for the source and drain, typically composed of Ti and Al with a capping metal such as Ni and Au, and gate metal 111 typically composed of a nickel (Ni) and gold (Au) metal contact over the p-type GaN gate.

FIG. 2 illustrates a cross-section of a prior art GaN transistor device without a surface passivating insulator, and is more fully more described in U.S. Pat. No. 8,350,294, issued to Lidow et al. GaN transistor 1 is formed on a substrate 31 that may comprise, for example, silicon Si, silicon carbide SiC or sapphire. Over and in contact with the substrate 31 are transition layers 32. Transition layers 32 comprise AlN or AlGaN, with a thickness of between 0.1 to 1.0 µm. A buffer layer 33 separates the transition layers 32 from a barrier layer 34. The buffer layer 33 is preferably formed of InAlGaN with any concentration of In and Al (including 0% In and/or Al) and has a thickness between 0.5 and 3 µm. The barrier layer 34 is formed of AlGaN and has a thickness between 0.005 and 0.03 µm and an Al percentage of about 10% to 50%. Source and drain contacts 35, 36 are disposed over the barrier layer. Source and drain contacts are formed of Ti or Al with a capping metal such as Ni and Au or Ti and TiN. A gate contact 37, formed of Ta, Ti, TiN, W, or WSi2, and having a thickness of between 0.05 and 1.0 µm, is provided between the source and drain contacts. A compensated semiconductor layer 38 is formed over the barrier layer 34 and under the gate contact 37. Compensated semiconductor layer 38 preferably comprises AlGaN or GaN with a deep level passivated p-type impurity such as, for example, Mg, Zn, Be, Cd, or Ca. Buffer layer 33 and barrier layer 34 are made of a III Nitride material, such as $In_xAl_yGa_{(1-x-y)}N$, where $x+y \le 1$. The high doping level of compensated layer 38 leads to an enhancement mode device. In addition, using a compensated semiconductor layer 38 leads to low gate leakage during device operation. Finally, the insulating nature of compensated layer 38 reduces the gate capacitance of the device.

The conventional GaN transistors shown in FIGS. 1 and 2 have several disadvantages. In most Si devices, the insulator/barrier interface (such as in FIG. 1) is not a critical parameter. In GaN transistors, however, it is a critical parameter, dominating device performance. A single layer of a surface passivating insulator, such as passivation layer 108 in FIG. 1, can be made to minimize leakage current and gate to drain capacitance, or it can be made to give high electron density in the channel and low drain field. But the single insulating passivation layer cannot be made to do both at the same time.

It therefore would be desirable to provide a GaN transistor that minimizes or eliminates leakage current and gate to drain capacitance, and that exhibits high electron density in the channel and low drain field, during device conduction.

SUMMARY OF THE INVENTION

The present invention in the various embodiments described below addresses the problems discussed above and other problems, by providing a column III nitride transistor, preferably a GaN transistor, that includes two or more insulator semiconductor interface regions to minimize or eliminate leakage current and gate to drain capacitance, while the device exhibits high electron density in the channel and low drain field, during device conduction.

Additional embodiments and additional features of embodiments for the transistor and method for fabricating the transistor are described below and are hereby incorporated into this section.

BRIEF DESCRIPTION OF THE DRAWINGS

The features, objects, and advantages of the present disclosure will become more apparent from the detailed description set forth below when taken in conjunction with the drawings in which like reference characters identify correspondingly throughout and wherein.

DETAILED DESCRIPTION OF THE PREFERRED EMBODIMENTS

Figure 1:
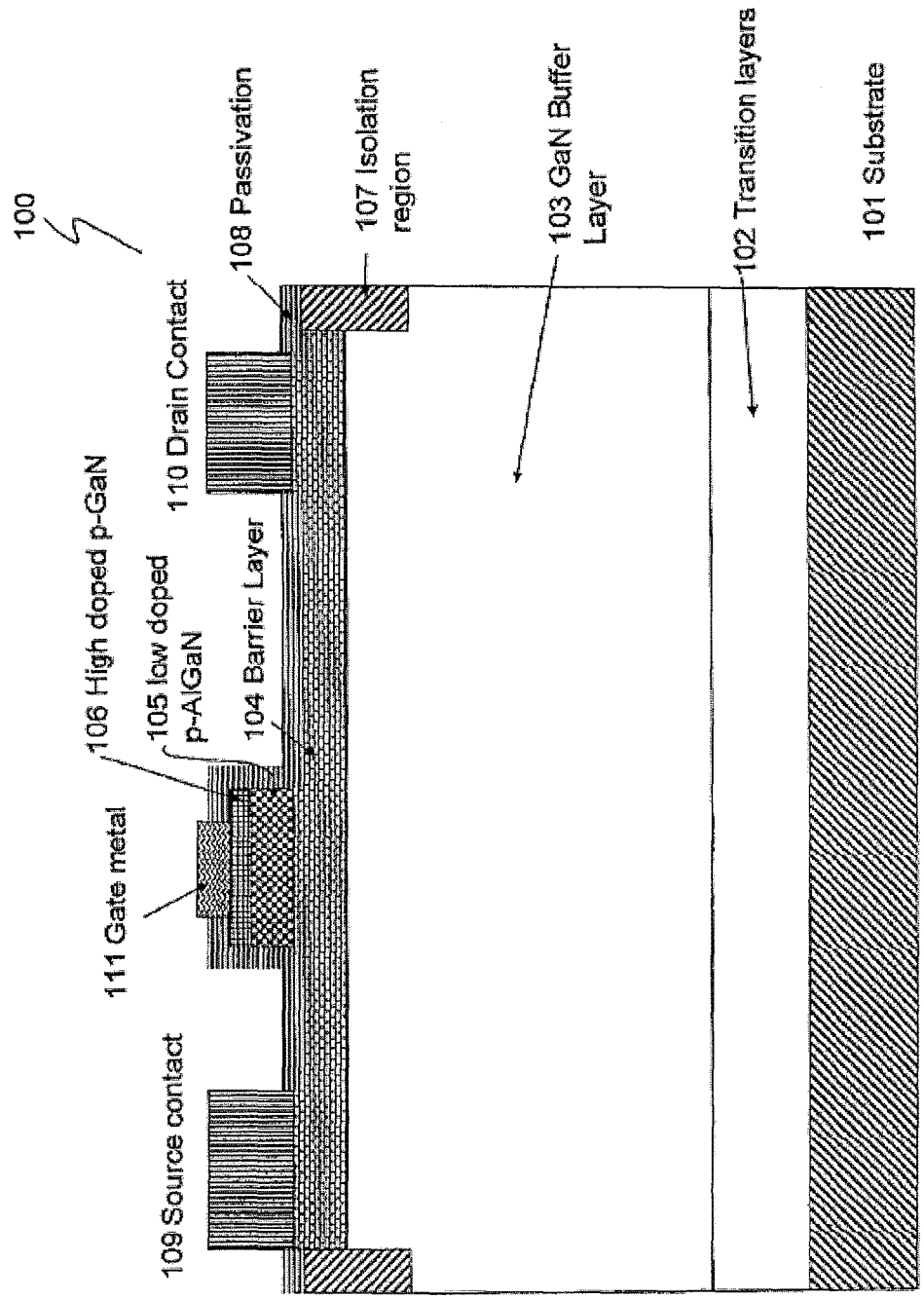
FIG. 1 illustrates a cross-sectional view of a conventional GaN transistor with a single layer of a surface passivating insulator.

In the following detailed description, reference is made to certain embodiments. This detailed description is merely intended to teach a person of skill in the art further details for practicing preferred aspects of the present teachings and is not intended to limit the scope of the claims. Therefore, combinations of features disclosed in the following detailed description may not be necessary to practice the teachings in the broadest sense, and are instead taught merely to describe particularly representative examples of the present teachings. It is to be understood that other embodiments may be employed and that various structural, logical, and electrical changes may be made.

Embodiments of the present invention split the surface passivation of a column III nitride transistor, preferably a GaN transistor, into multiple regions by utilizing two or more passivation insulator semiconductor interface regions (i.e., insulator layers) positioned at least between the gate and drain contacts of the transistor. The insulator layers are employed to minimize or eliminate leakage current and gate to drain capacitance, while the transistor also exhibits high electron density in the channel and low drain field during device conduction. The insulator layers of the present invention may be employed with any column III nitride transistor, the conventional GaN transistor shown in FIG. 2 and described above, or with other GaN transistors such as those described below and those shown in the drawings.

In a preferred embodiment, the present invention is directed to a column III nitride transistor, preferably a GaN transistor, comprising: a substrate; a transition layer positioned above the substrate, where the transition layer comprises a column III nitride material; a buffer layer comprising a column III nitride material positioned above the transition layer; a barrier layer comprising a column III nitride material positioned above the buffer layer; a channel comprising a conductive two-dimensional electron gas (2DEG) formed in the buffer layer at the junction with the barrier layer; gate, drain, and source contacts positioned above the barrier layer, where the gate contact is positioned between the source and drain contacts; and a first insulator and a second insulator positioned above the barrier layer and at least between the gate and drain contacts. The first insulator is nearer to the gate contact than the second insulator. The net electron donor density above the channel under the first insulator is lower than the net electron donor density above the channel under the second insulator, such that the 2DEG density in the channel under the second insulator is higher than the 2DEG density in the channel under the first insulator.

The substrate may comprise one or more substrate layers. The transition layer may comprise one or more transition layers. The buffer layer may comprise one or more buffer layers. The barrier layer may comprise one or more barrier layers.

In an embodiment, the first insulator has fewer electrons in surface states than in the second insulator.

In an embodiment, the transistor further comprises an insulator offset layer positioned at least between the second insulator and the barrier layer. The insulator offset layer may comprise one or more of AlN, AlGaN, and GaN materials. In a preferred embodiment, the insulator offset layer is formed of a layer of AlN and a layer of GaN. The insulator offset layer may or may not be doped. The drain contact may be in contact with the barrier layer through a removed portion (such as by etching) of the insulator offset layer. The insulator offset layer may be further positioned between the drain contact and the barrier layer. The insulator offset layer may comprise one or more insulator offset layers.

In an embodiment, the transistor further comprises a metal field plate positioned above at least one of the first insulator and the second insulator.

In an embodiment, the transistor further comprises a metal field plate positioned above the first insulator and at least between the gate and drain contacts, and not above the second insulator.

In an embodiment, the transistor further comprises a metal field plate positioned above the first insulator and the second insulator and at least between the gate and drain contacts.

In an embodiment, the transistor further comprises a metal field plate positioned above at least one of the first insulator and the second insulator and at least between the gate and drain contacts, wherein the metal field plate positioned between the gate and drain contacts comprises multiple steps with varying heights.

In an embodiment, the second insulator is further positioned above an entirety of the first insulator.

In an embodiment, the second insulator is further positioned above only a portion of the first insulator.

In an embodiment, the first insulator is further positioned above an entirety of the second insulator.

In an embodiment, the first insulator is further positioned above only a portion of the second insulator.

In an embodiment, the transistor further comprises a third insulator positioned above the second insulator and at least between the gate and drain contacts. In an embodiment, the third insulator may be further positioned above the first insulator. In an embodiment, the transistor further comprises a metal field plate positioned above the first insulator and the third insulator and at least between the gate and drain contacts, and is not positioned above the second insulator. In an embodiment, the transistor further comprises a metal field plate positioned above the first insulator, second insulator, and third insulator, and at least between the gate and drain contacts.

Figure 2:
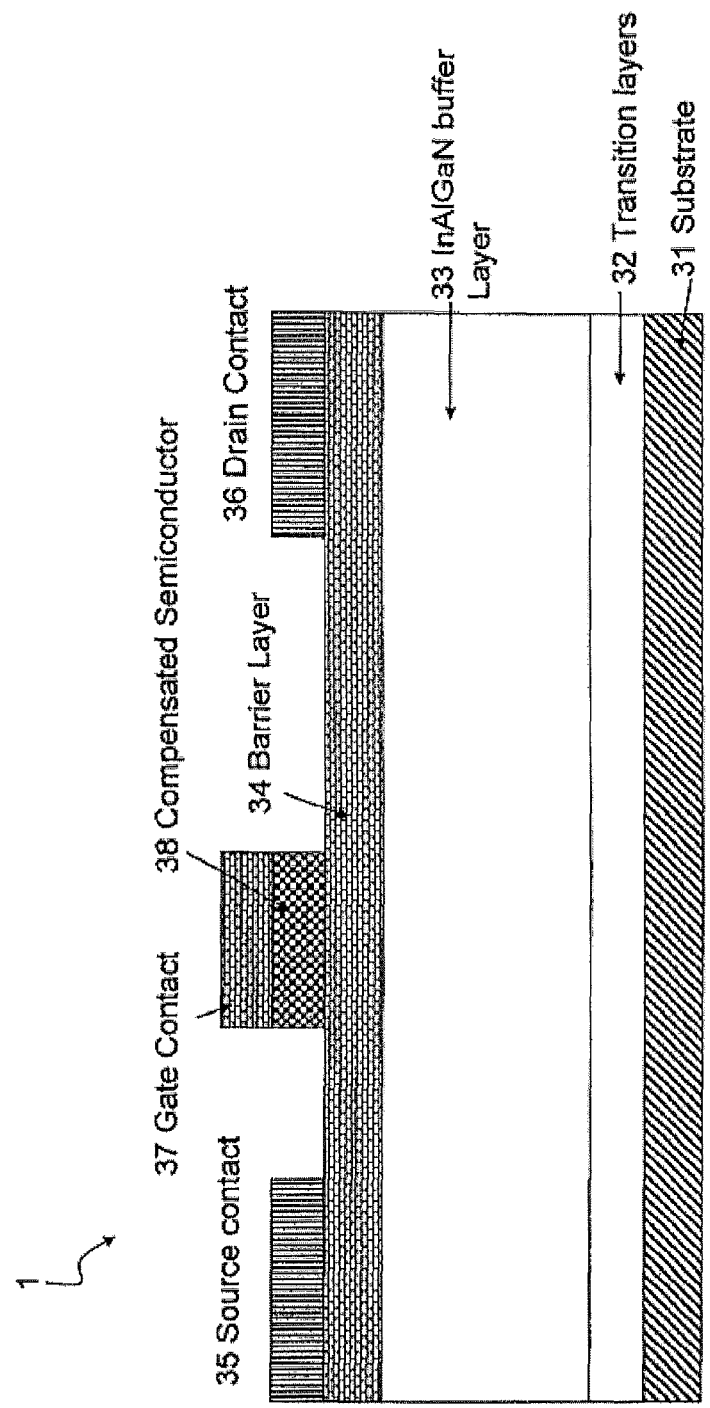
FIG. 2 illustrates a cross-sectional view of a conventional GaN transistor without a surface passivating insulator.
Figure 3:
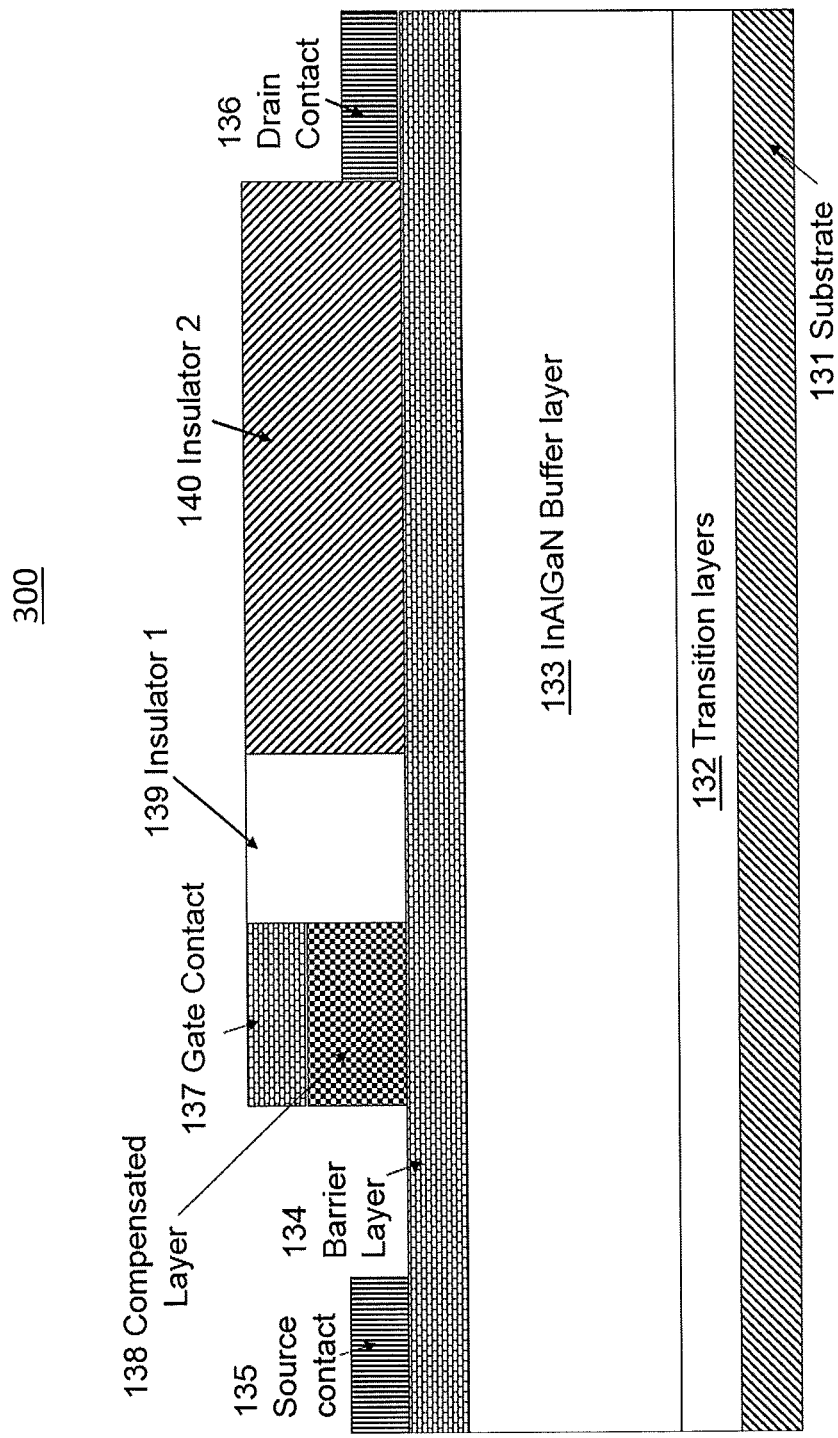
FIG. 3 illustrates a cross-sectional view of a GaN transistor formed according to a first embodiment of the present invention.

FIG. 3 illustrates a cross-sectional view of a GaN transistor 300 formed according to a first embodiment of the present invention. A first insulator (insulator 139) is disposed between the gate and drain and above the barrier layer 134. First insulator 139 minimizes the gate leakage and fields near the gate that cause high gate-drain charge ($Q_{gd}$). An adjacent second insulator (insulator 140) minimizes electric fields at the drain contact and provides a high density of charge in the channel for low resistance. The remaining elements/layers of this transistor may be, for example, those shown in the conventional transistor of FIG. 2, as described above, and thus are hereby incorporated within this and other sections of the detailed description. These elements/layers include substrate 131, transition layers 132, buffer layer 133, source contact 135, drain contact 136, gate contact 137, and compensated layer 138.

Figure 4:
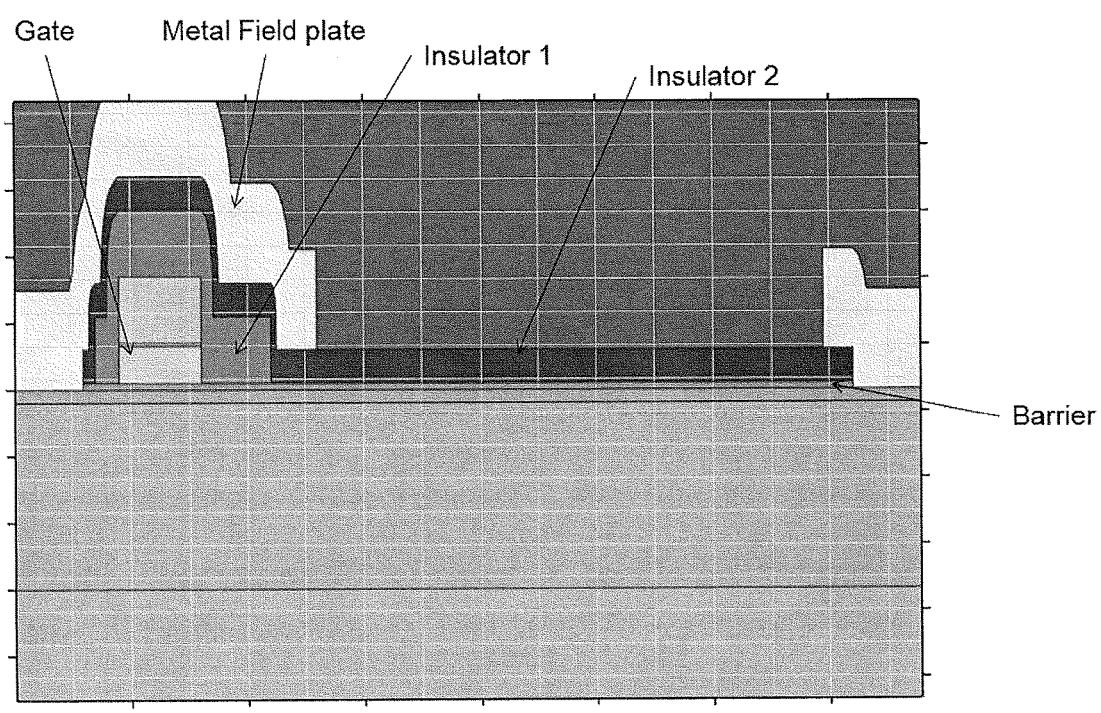
FIG. 4 illustrates a cross-sectional view of a GaN transistor formed according to a second embodiment of the present invention.

FIG. 4 illustrates a cross-sectional view of a GaN transistor formed according to a second embodiment of the present invention. FIG. 4 depicts a more accurate picture showing the locations and relative dimensions of insulator 1 and insulator 2. Also included in FIG. 4 is a metal field plate that protects the gate region from high fields. The metal field plate is positioned above insulator 1 in its entirety, while being positioned above only a portion of insulator 2.

The various layers in the transistors shown in FIGS. 3 and 4 or other embodiments below and/or in any of the drawings may be formed using the processes described for fabricating the device in FIG. 2 in U.S. Pat. No. 8,350,294, issued to Lidow et al. For example, the buffer, channel, barrier, and gate layers may each be formed by, for example, nucleation. Once the gate metal is deposited, patterning and then etching of the gate material may be performed. The insulator 1 is deposited, then patterned, following by selective etching in order to stop the etching on the barrier. Compared to the FIG. 1 process flow for forming passivation layer 108, the insulator 139 in FIG. 3 is formed with a reduced thickness ranging from ~100 nm to ~20 nm. Insulator 2 is then deposition, patterned, and then etched to form ohmic openings. The remaining steps in the process flow may be similar or the same as those in the conventional device mentioned above. For example, metal is deposited, patterned, and etched to form an ohmic contact to the barrier and to form the field plate.

Oxide deposition may be employed for further metal layers for routing.

Insulator 2 is preferably formed with a thickness in the range of 50-500 nm and is preferably made of SiN deposited at high temperature in the range of 600-900° C.

Typical GaN processing for SiN deposition is 300° C. or greater in plasma-enhanced chemical vapor deposition (PECVD).

For the first two embodiments (FIGS. 3 and 4), the first and second insulators (i.e., insulators 1 and 2) can be formed of the same material, such as SiN, but with different process conditions, such that insulator 1 produces a lower interface density of donor states than insulator 2. Many process conditions and factors (surface cleaning, plasma exposure, pre-deposition surface preparation and gas sequencing) can influence the density of donor states in a material.

In a preferred embodiment, the insulator layers in the transistor of the present invention are formed using high pressure deposition conditions, such as 200-400 mbar for low interface states, and low pressure deposition conditions, such as 10-100 mbar, for high interface states.

In a preferred embodiment, because interface doping is often not the best way to make a device, the lowest interface density is actually used in the "high interface density" region, and the insulator offset layer is added to add doping that is controllable.

In the present invention, the "net doping" in the region between the first insulator layer and the channel is less than the "net doping" in the region between the second insulator layer and the channel, where "net doping" is the combination of surface donors and intentional doping of the barrier layer and any insulator offset layer in that region. Net doping in the regions can be controlled by surface pre-deposition actions, such as high temperature exposure to $NH_3$ for 1-10 minutes at temperatures of 300-800° C. to control interface state density. Doping of the AlGaN barrier layer can be accomplished through flow of $SiH_4$ during deposition, such as setting the $SiH_4$ flow rate to be $\frac{1}{1000}^{th}$ of the Tri-Methyl-Gallium flow rate during the barrier layer growth performed at 700-1200° C. Doping of the one or more of the insulator offset layers can be made by flow of a similar ratio of $SiH_4$ to TMG (Tri-Methyl-Gallium) during insulator offset layer growth at 700-1200° C.

Figure 5A:
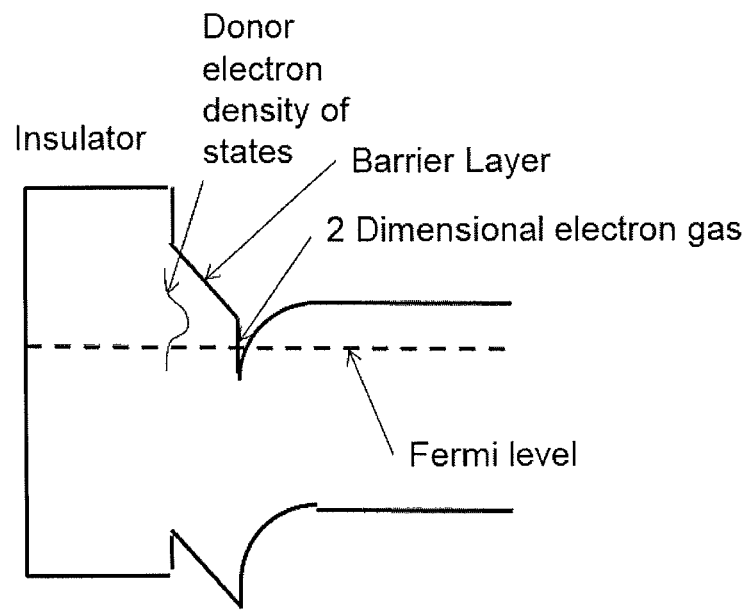
FIGS. 5A and 5B are band diagrams of an insulator over a barrier layer illustrating the interface density of states vs. energy position in the band gap according to the second embodiment of the present invention.
Figure 5B:
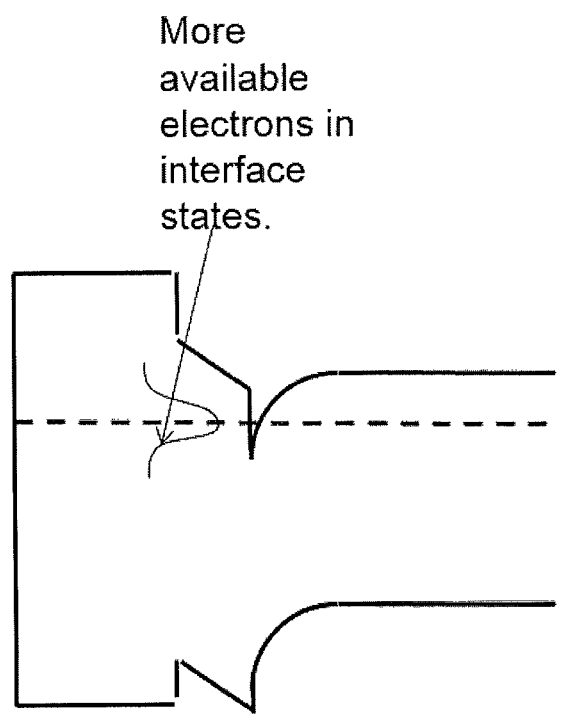

FIGS. 5A and 5B are band diagrams of an insulator over a barrier layer illustrating the interface density of states vs. energy position in the band gap according to the second embodiment of the present invention. With reference to FIG. 5A, an insulator of type 1 (i.e., the first insulator) shows a smaller density of electron donors leading to most donor states being empty. Fermi level is reached when the probability of a state being full is one-half. If a donor state is above the Fermi level, it is mostly empty. With reference to FIG. 5B, an insulator of type 2 (i.e., the second insulator) shows a larger density of electron donors leading to many available electrons in the donor states. States below the Fermi level are mostly full of electrons. Thus, in relative terms, a net electron donor density above the barrier layer is lower under the first insulator than under the second insulator.

Figure 6:
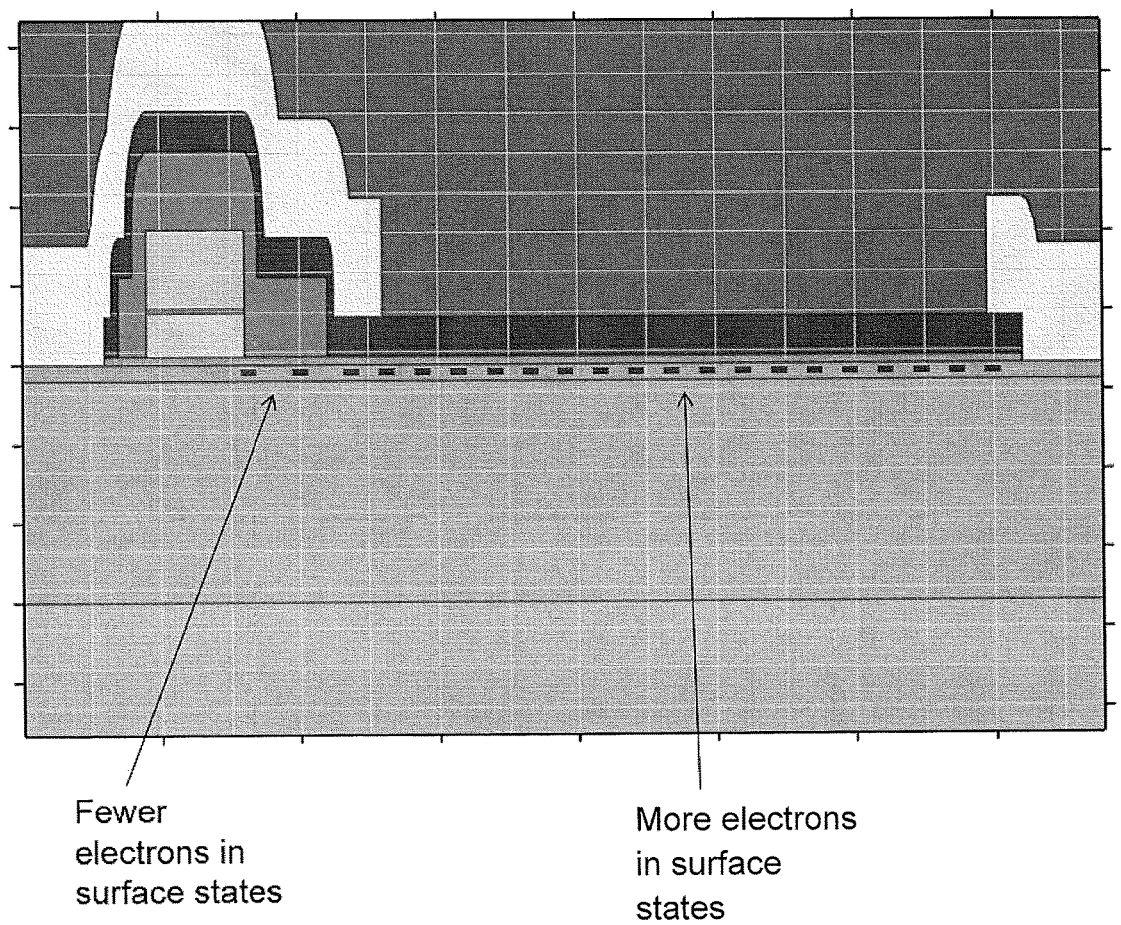
FIG. 6 illustrates a cross-sectional view of the GaN transistor formed according to the second embodiment of the present invention, which includes a depiction of electron quantities in surface states.

FIG. 6 illustrates a cross-sectional view of the GaN transistor according to the second embodiment of the present invention, including a depiction of electron quantities in surface states. As shown in FIG. 6, there are fewer electrons in surface states closer to the gate in the buffer layer adjacent the buffer layer—barrier layer interface.

Figure 7:
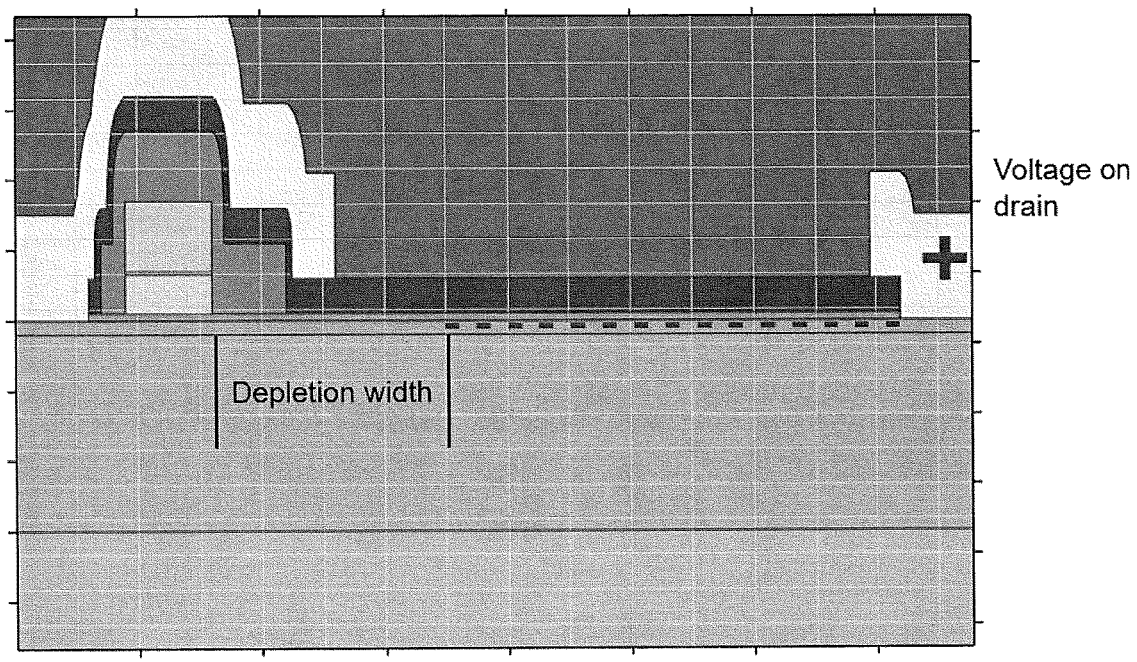
FIG. 7 illustrates a cross-sectional view of the GaN transistor formed according to the second embodiment of the present invention, which includes a depiction of electron depletion width when voltage is applied to the drain.

FIG. 7 illustrates a cross-sectional view of the GaN transistor according to the second embodiment of the present invention, which includes a depiction of the electron depletion width when voltage is applied to the drain. When voltage is applied to the drain, the electrons from the surface and 2DEG are pulled toward the positive voltage. The region in which electrons are depleted starts at the edge of the gate and extends a distance toward the drain—i.e., the depletion width. The higher the voltage at the drain, the larger the depletion width.

Figure 8:
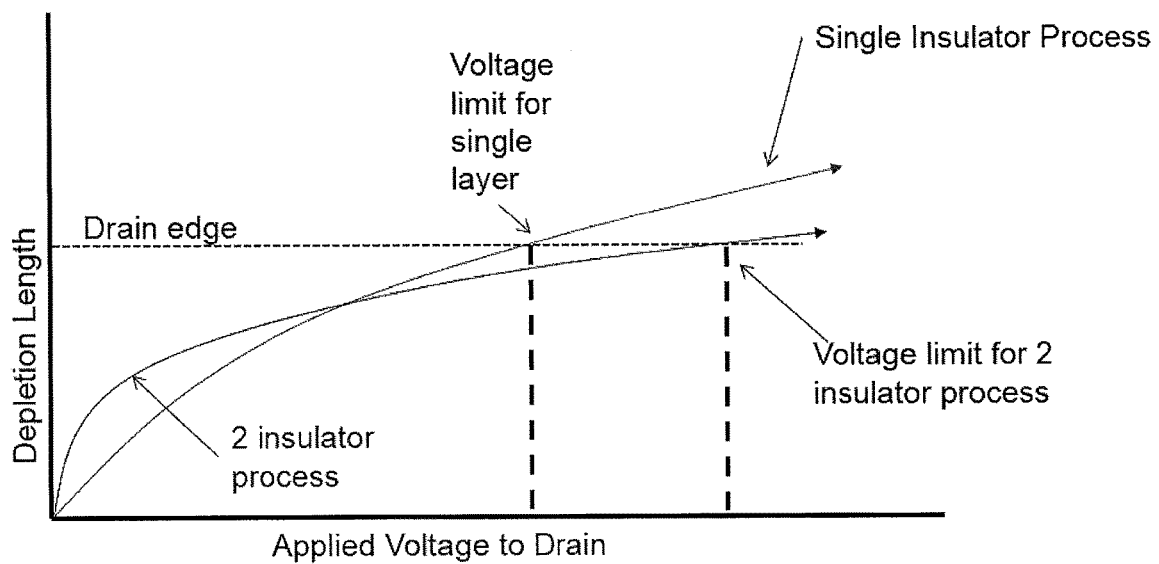
FIG. 8 is a plot of depletion length vs. applied voltage to drain for the GaN transistor formed according to the second embodiment of the present invention.

FIG. 8 is a plot of depletion length vs. applied voltage to the drain of the GaN transistor according to the second embodiment of the present invention. A low bias region, i.e., the insulator 1 region, has a faster rise in depletion length. This is better than a single insulator process (such as in the FIG. 1 device) because it results in a lower $Q_{dg}$ and less charge is pulled into the gate. In the high bias region, i.e., insulator 2 region, the depletion is very slow to rise. This is beneficial because the depletion length can only go to the drain edge before the device will start to have changes to resistance over time. Having two insulator processes allows for a higher voltage before resistance changes.

Figure 9:
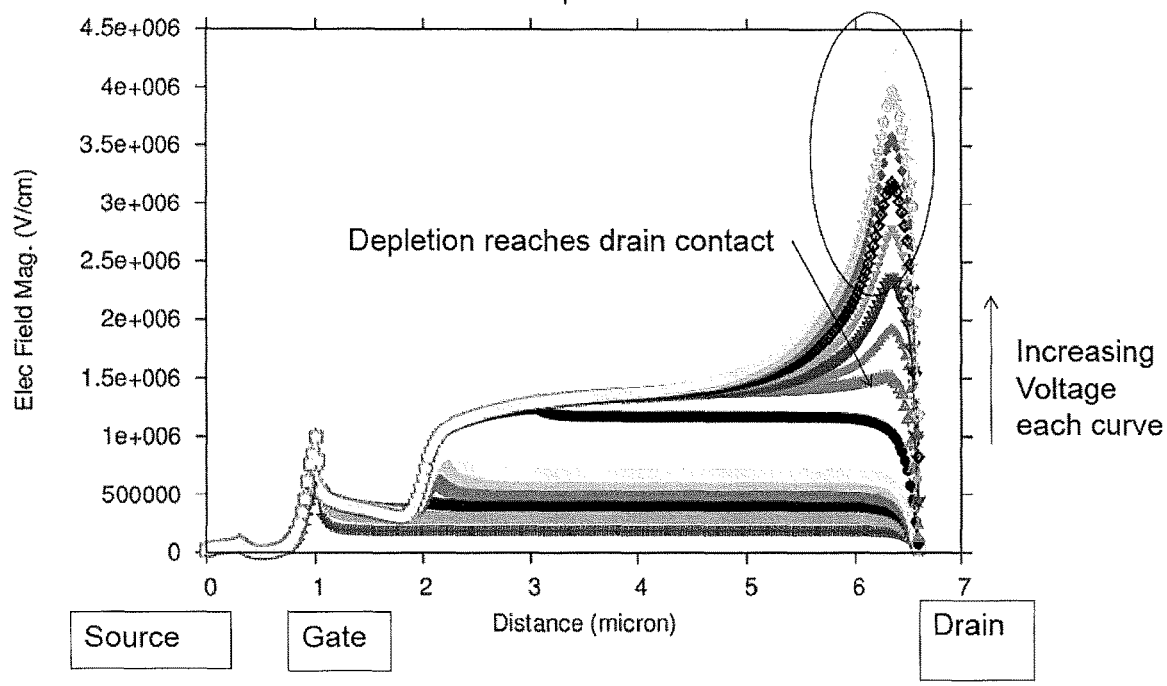
FIG. 9 is a plot of electromagnetic field vs. distance to drain for the GaN transistor formed according to the second embodiment of the present invention.

FIG. 9 is a plot of electromagnetic field vs. distance to drain for the GaN transistor according to the second embodiment of the present invention. As shown in FIG. 9, near the drain, the fields start to increase greatly after a certain voltage is applied. That voltage, when the field begins rising quickly, is when depletion width reaches the drain contact.

Thus, the advantages of a two step insulator in the first and second embodiments, is lower $Q_{dg}$ and higher voltage operation without changes to resistance over time.

Figure 10:
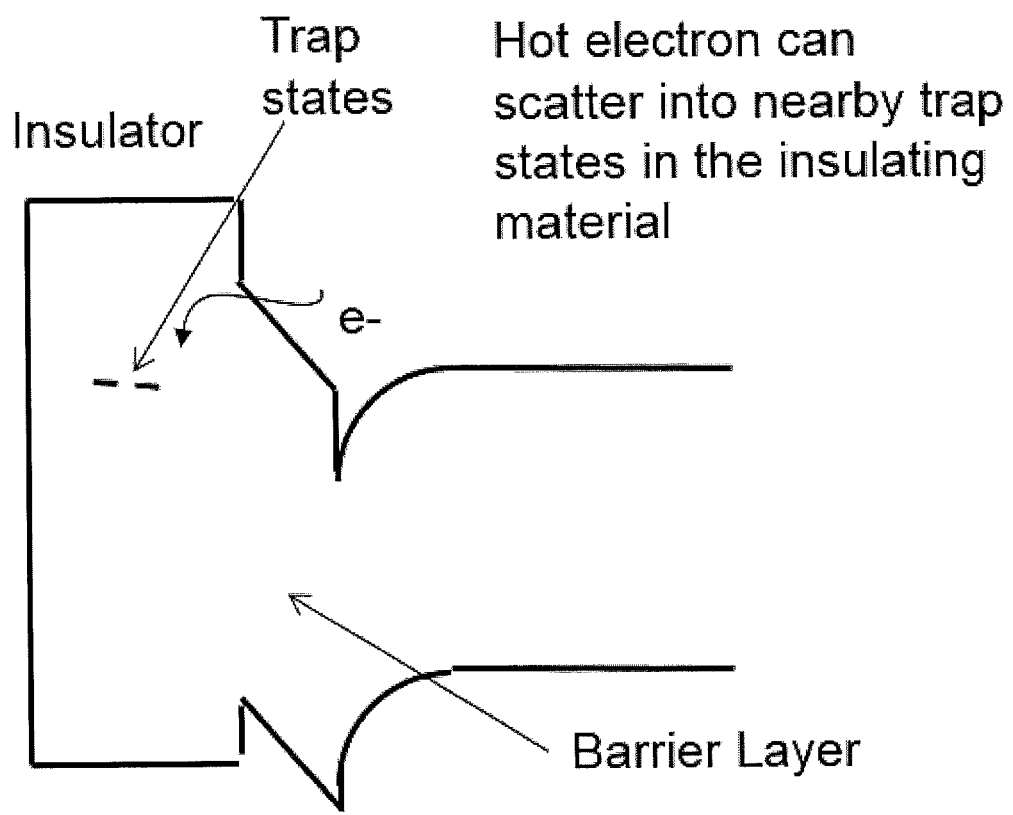
FIG. 10 is a band diagram of an insulator over a barrier layer illustrating the scattering of hot electrons into nearby trap states in the band gap according to the second embodiment of the present invention.

FIG. 10 is a band diagram of an insulator over a barrier layer illustrating the scattering of hot electrons into nearby trap states in the band gap according to the second embodiment of the present invention. The limit of the voltage before Rdson changes is caused by high electric fields and "hot electrons." When leakage current occurs, the electrons travel in the region right below the barrier layer, from the gate/source side to the drain side. In regions with high electric field, the electrons travel faster. If the field is very high, the electrons can gain a lot of energy. When they hit something and scatter, they can scatter out of the channel into places in the barrier, into the interface, or into the insulator above the barrier. If there are states available, they can enter those states. Those states are called trap states because they trap electrons.

Figure 11:
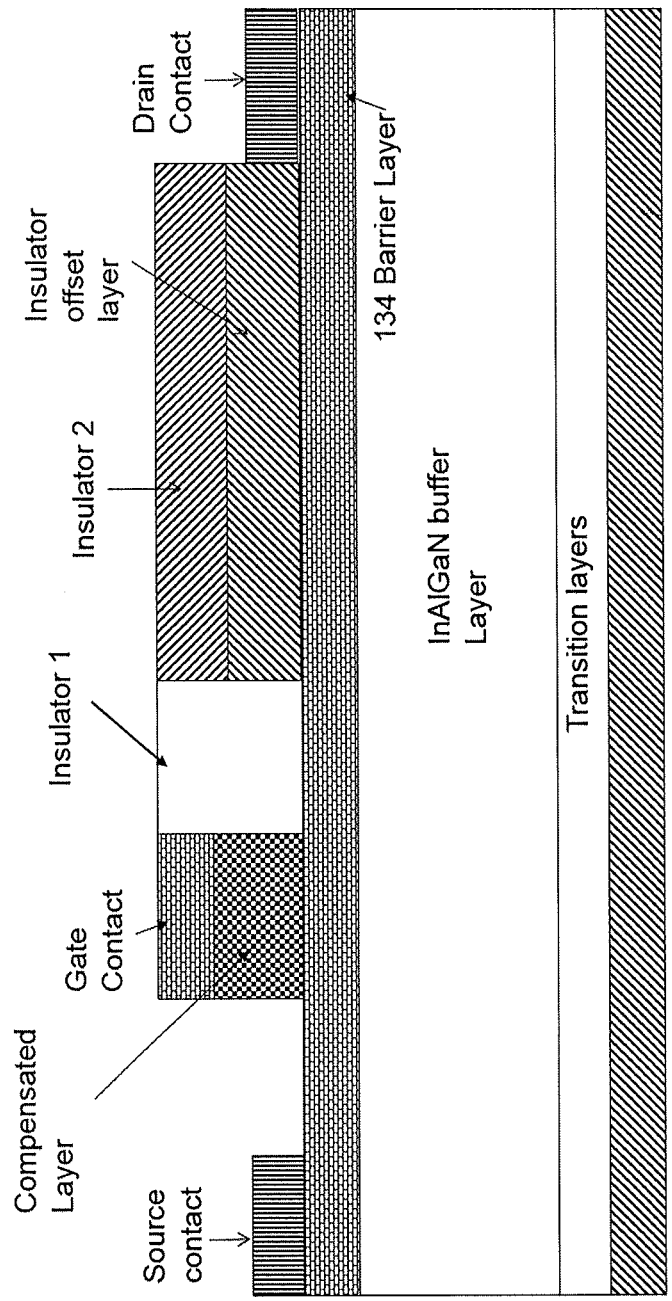
FIG. 11 illustrates a cross-sectional view of a GaN transistor formed according to a third embodiment of the present invention.

FIG. 11 illustrates a cross-sectional view of a GaN transistor formed according to a third embodiment of the present invention. As shown in FIG. 11, an insulator offset layer is positioned between the second insulator and the barrier layer 134.

Figure 12:
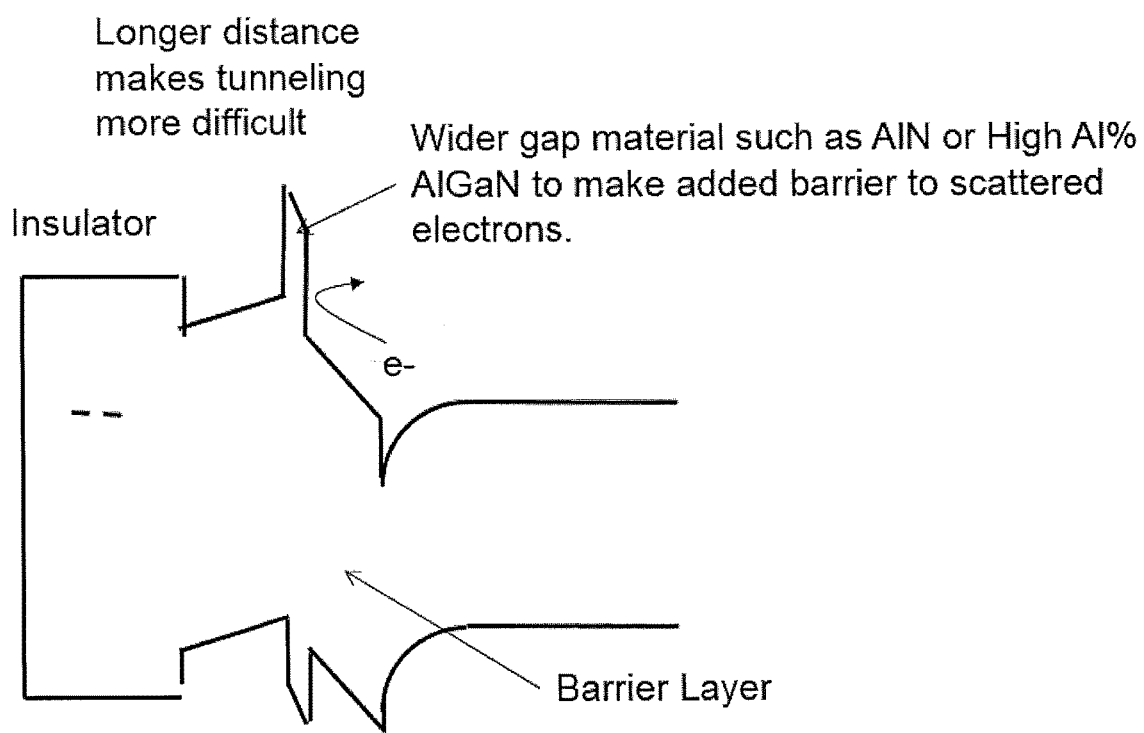
FIG. 12 is a band diagram of an insulator over a barrier layer while using an intermediary semiconductor offset layer in the band gap according to the third embodiment of the present invention.
Figure 13A:
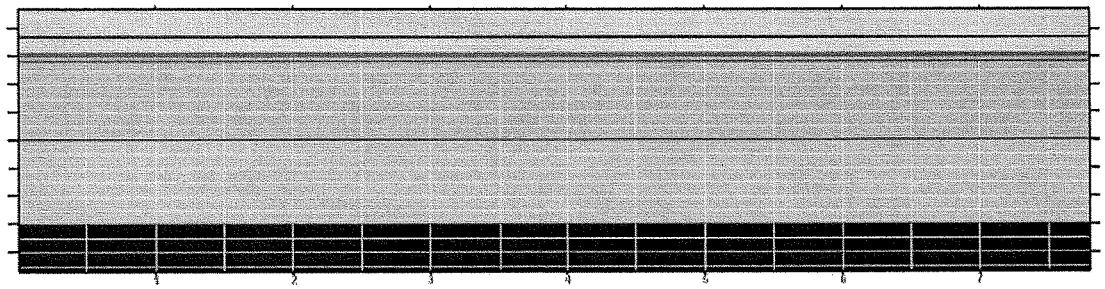
FIGS. 13A-13G illustrate an exemplary process flow for fabricating the GaN transistor according to the second embodiment of the present invention.
Figure 13B:
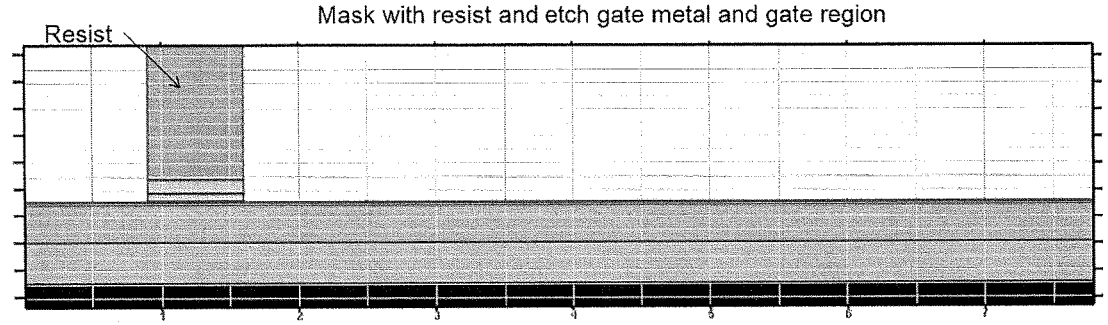
Figure 13C:
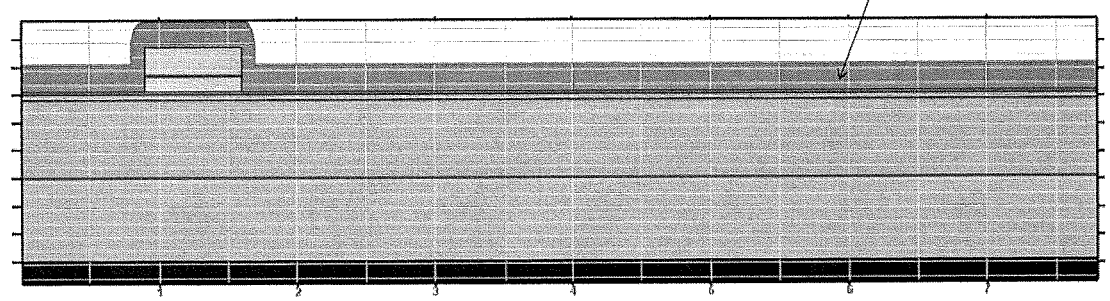
Figure 13D:
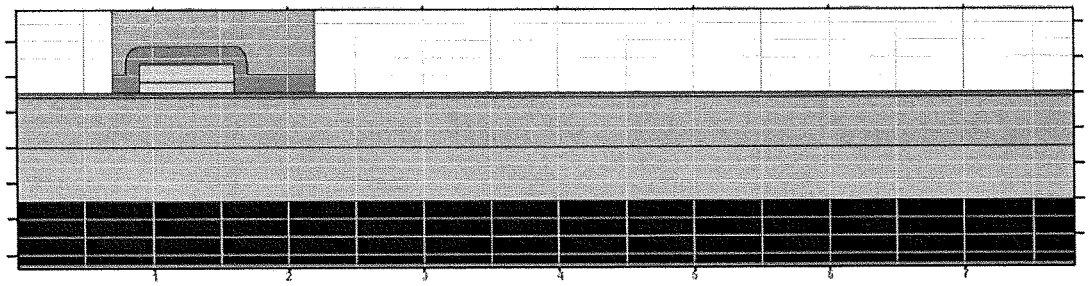
Figure 13E:
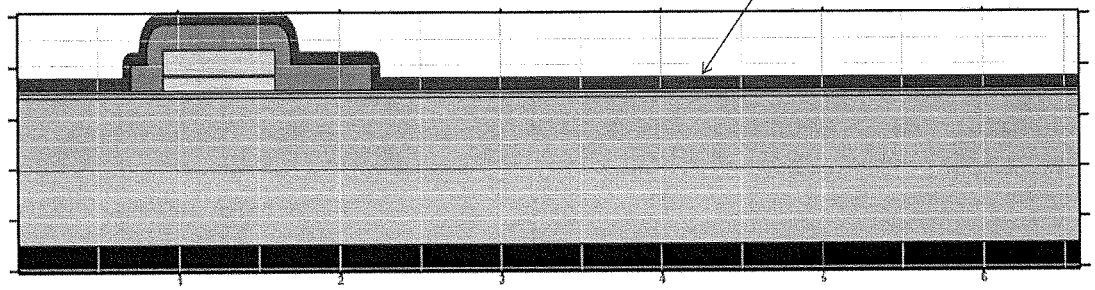
Figure 13F:
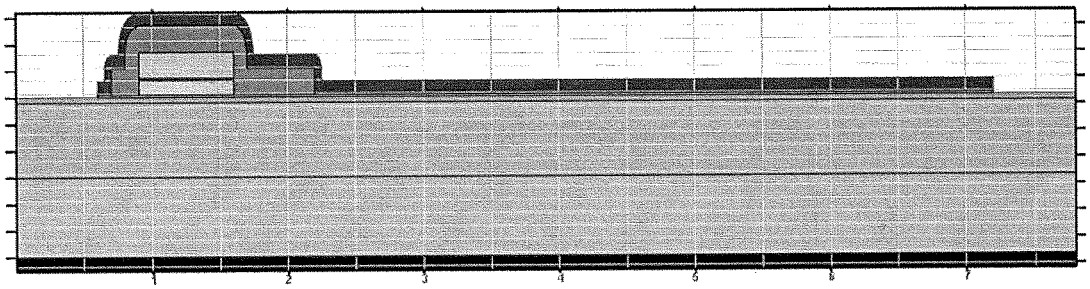
Figure 13G:
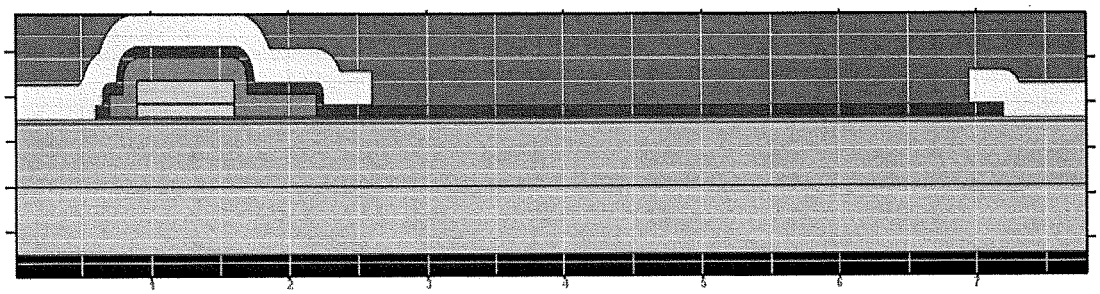

FIG. 12 is a band diagram of an insulator over a barrier layer while using an intermediary semiconductor (insulator) offset layer in the band gap according to the third embodiment of the present invention. The third embodiment is based on moving the trap-containing insulator, such as SiN, farther away from the channel by use of a semiconductor offset layer between the barrier and the second insulator. By making it a wide bandgap material for one of the layers, a higher barrier is created for the hot electrons to overcome.

FIGS. 13A-13G illustrate an exemplary process flow for fabricating the GaN transistor according to the second embodiment of the present invention.

Figure 14:
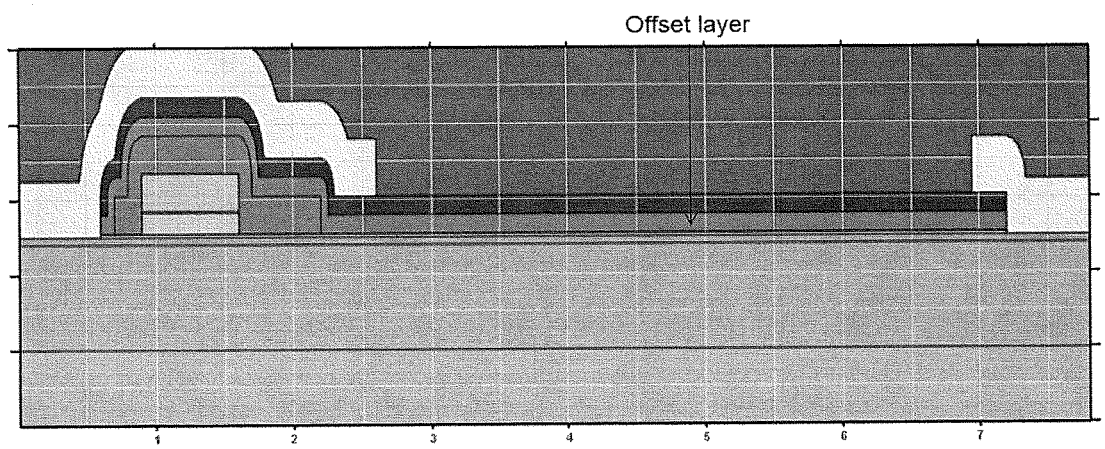
FIG. 14 illustrates the formation of the GaN transistor according to the third embodiment of the present invention.

FIG. 14 illustrates the formation of the GaN transistor according to the third embodiment of the present invention. The device formation process of the third embodiment is the same as that shown in FIGS. 13A-13G, except the (insulator) offset layer is deposited before insulator 2. The offset layer may optionally be doped with donor atoms.

Figure 15A:
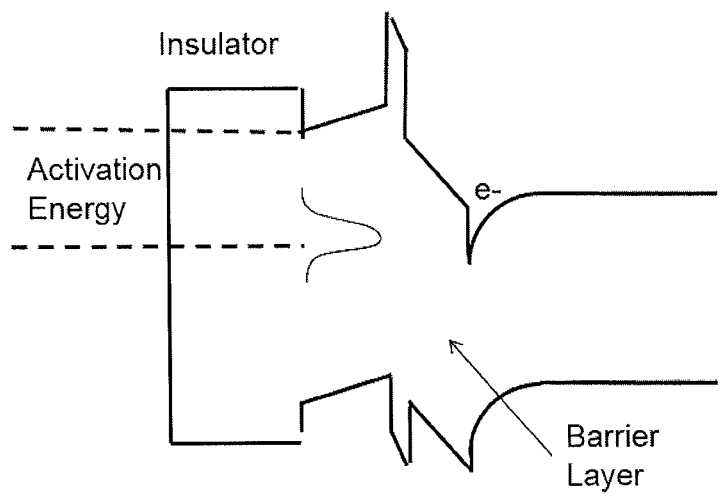
FIGS. 15A and 15B are band diagrams illustrating a motivation for doping of an intermediary semiconductor offset layer in the band gap according to the third embodiment of the present invention.
Figure 15B:
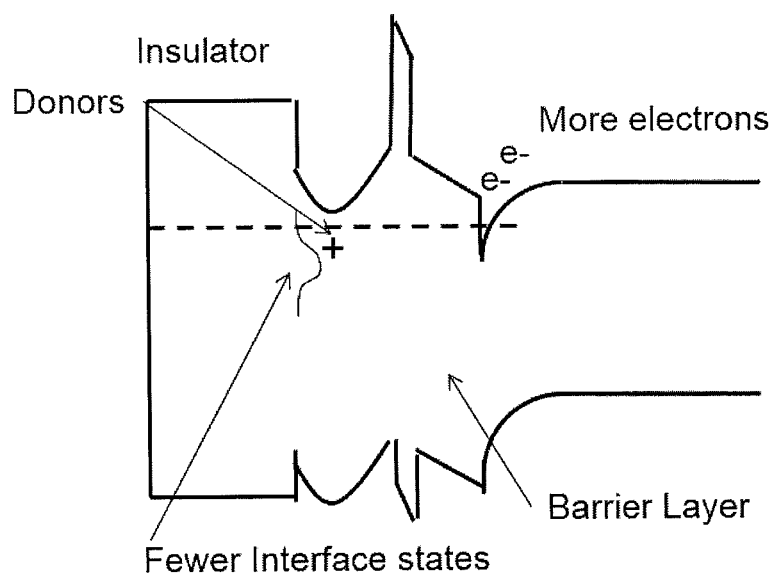

FIGS. 15A and 15B are band diagrams illustrating the reason for doping an intermediary semiconductor offset layer (i.e., the insulator offset layer) according to the third embodiment of the present invention. With respect to FIG. 15A, the interface states that are used to reduce electric field at the drain edge have a rather large energy barrier to emission, referred to as the activation energy. The activation energy makes them take a certain time to respond to electric fields. A larger activation energy equals longer emission time. In switching applications, times can get much smaller than the time required for interface electrons to respond. As shown in FIG. 15B, by using a combination of lower interface states and doping of the insulator offset layer, the device can achieve very low activation energies, such as 10 mV for Si in GaN. This gives a tremendous boost to response times. In addition, the electrons that previously resided at the interface are now replaced with donors that give those electrons to the 2DEG. This increases the conductivity of the device, thereby improving performance. In a preferred embodiment of the invention, the 2DEG sheet resistance under the second insulator is 450 Ω/sq (or in the range of 350-600 Ω/sq) and the 2DEG sheet resistance under the first insulator is 800 Ω/sq (or in the range of 600-1000 Ω/sq).

Figure 16:
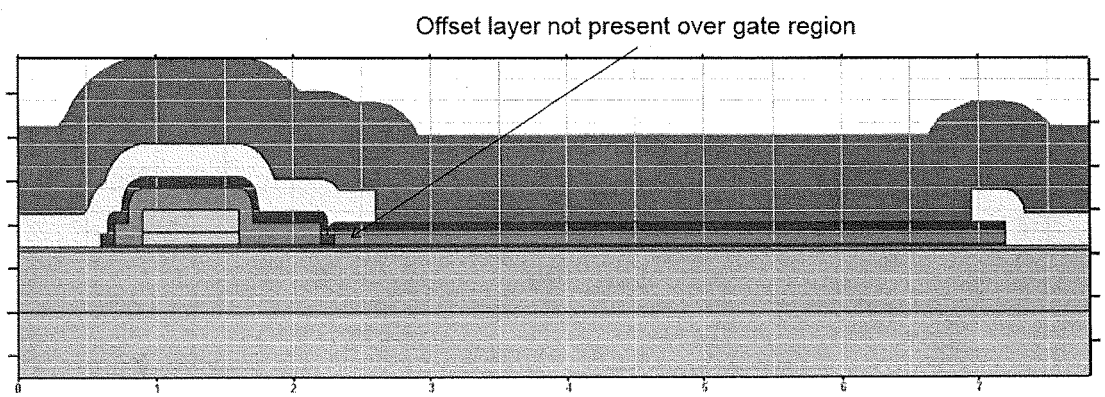
FIG. 16 illustrates a cross-sectional view of a GaN transistor formed according to a fourth embodiment of the present invention.

FIG. 16 illustrates a cross-sectional view of a GaN transistor formed according to a fourth embodiment of the present invention. This embodiment is similar to the third embodiment, but with the removal of the insulator offset layer over the gate region. This can be done by either selective deposition or mask and etch. In GaN growth, it is actually difficult to force growth on insulators such as SiN and $SiO_2$, so selective deposition is the easiest way to not have the insulator offset region present over the gate.

Figure 17:
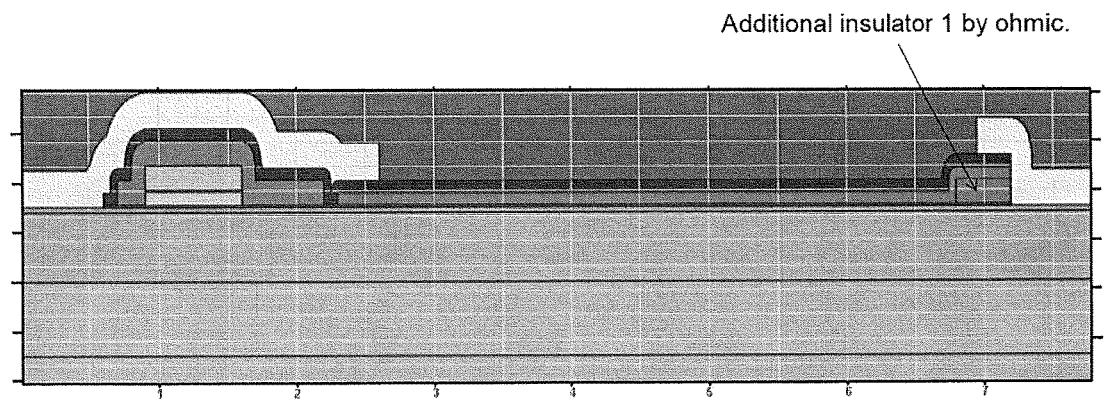
FIG. 17 illustrates a cross-sectional view of a GaN transistor formed according to a fifth embodiment of the present invention.

FIG. 17 illustrates a cross-sectional view of a GaN transistor formed according to a fifth embodiment of the present invention. This embodiment is similar to the fourth embodiment, except that some of insulator 1 remains near the drain region. This is advantageous for the process because making an ohmic contact to the 2DEG region through the offset spacer layer can be difficult.

Figure 18:
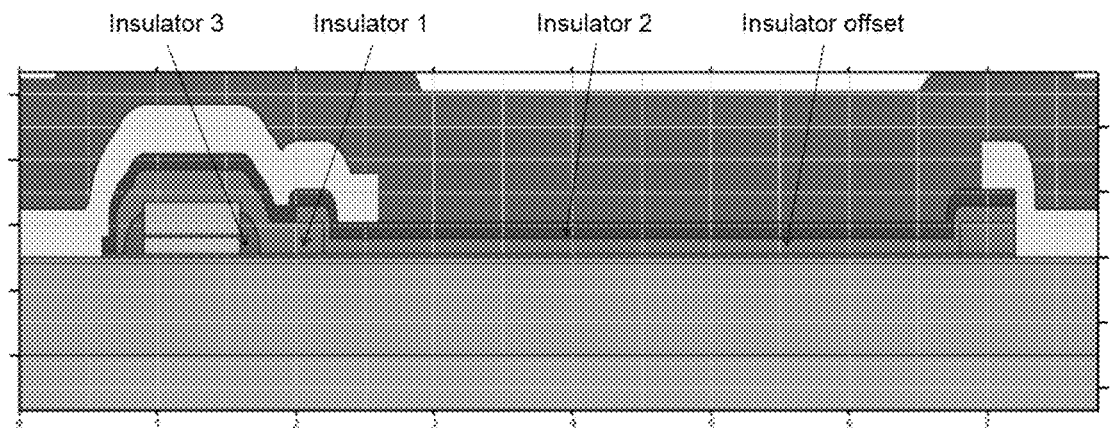
FIG. 18 illustrates a cross-sectional view of a GaN transistor formed according to a sixth embodiment of the present invention.

FIG. 18 illustrates a cross-sectional view of a GaN transistor formed according to a sixth embodiment of the present invention. The sixth embodiment includes a third insulating material near the edge of the gate. This can be created using self-aligned etch-back. This process involves the deposition of a thin layer that coats a side wall, followed by a direct etch without masking. The goal is to have an even lower interface density along the side of the gate to reduce gate leakage, and reduce $Q_{gd}$ even further. It could be created using a mask-based process as well. The goal is to have the lowest electron density near gate, and the highest in a region in/on the middle/drain side.

Figure 19:
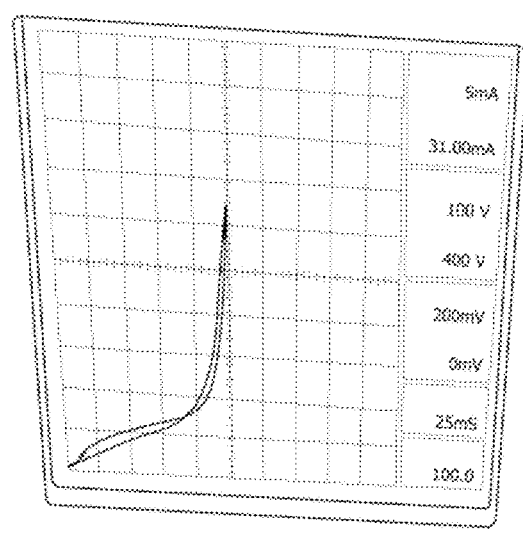
FIG. 19 is a plot of a 200V part taken to a 500V breakdown, where the current is going up repeatedly without breaking the device and without causing resistance changes, for the GaN transistor according to any of the embodiments of the present invention described throughout this disclosure.

FIG. 19 is a plot of a 200V part taken to a 500V breakdown, where the current is rising repeatedly without breaking the device and without causing resistance changes, showing how the two step insulator process of the present invention results in stable breakdown. The result is a doubling of performance of the part for breakdown with stable resistance, and the device now has a stable breakdown mechanism. This allows the device to withstand over-voltages—a major benefit in applications where the load is inductive such as motor drives. Normally the transistor would just break and be shorted after this type of pulse.

Figure 20:
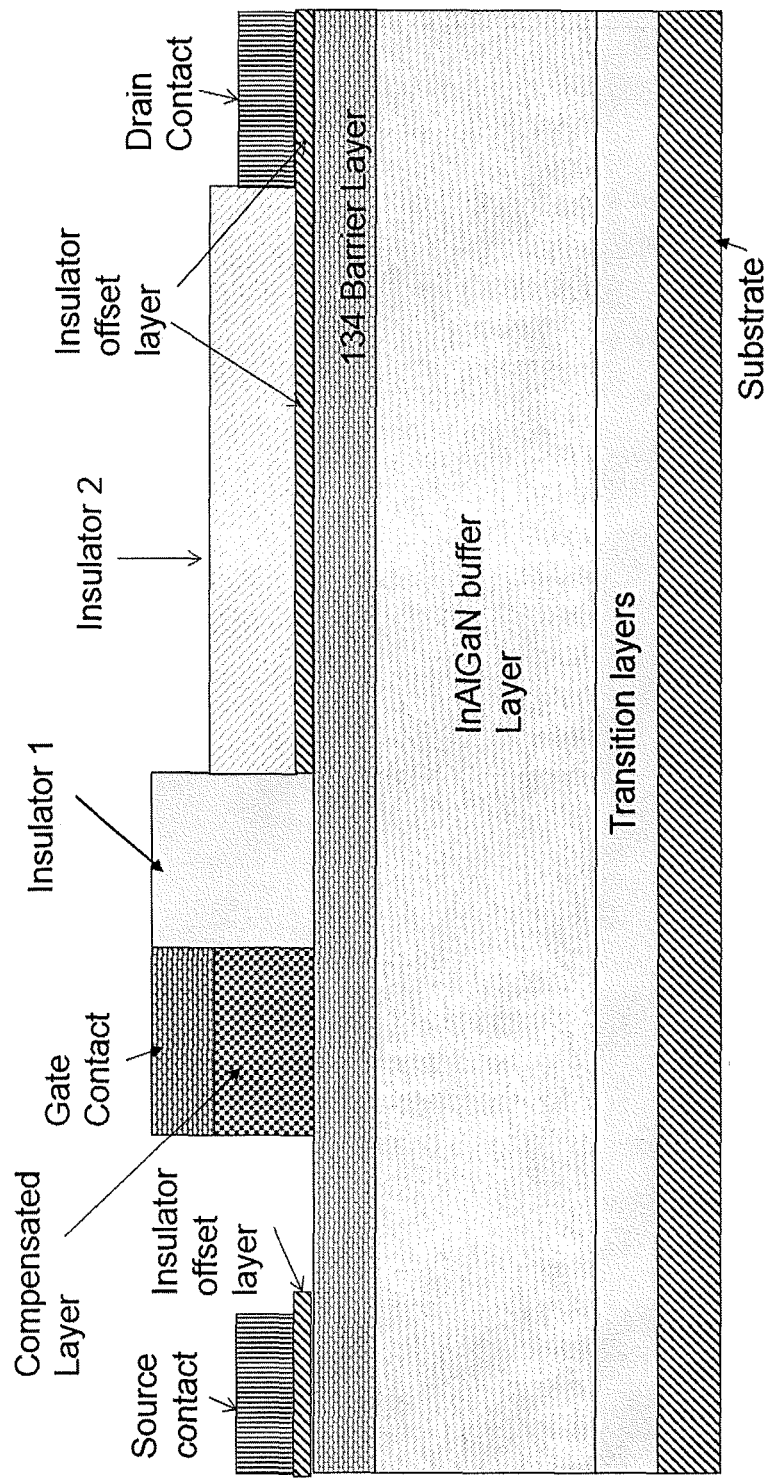
FIG. 20 illustrates a cross-sectional view of a GaN transistor formed according to a seventh embodiment of the present invention.

FIG. 20 illustrates a cross-sectional view of a GaN transistor formed according to a seventh embodiment of the present invention. The seventh embodiment is based on the third embodiment. The insulator offset layer is under the source and/or the drain contact, which may reduce drain/source to channel ohmic contact resistance.

Figure 21:
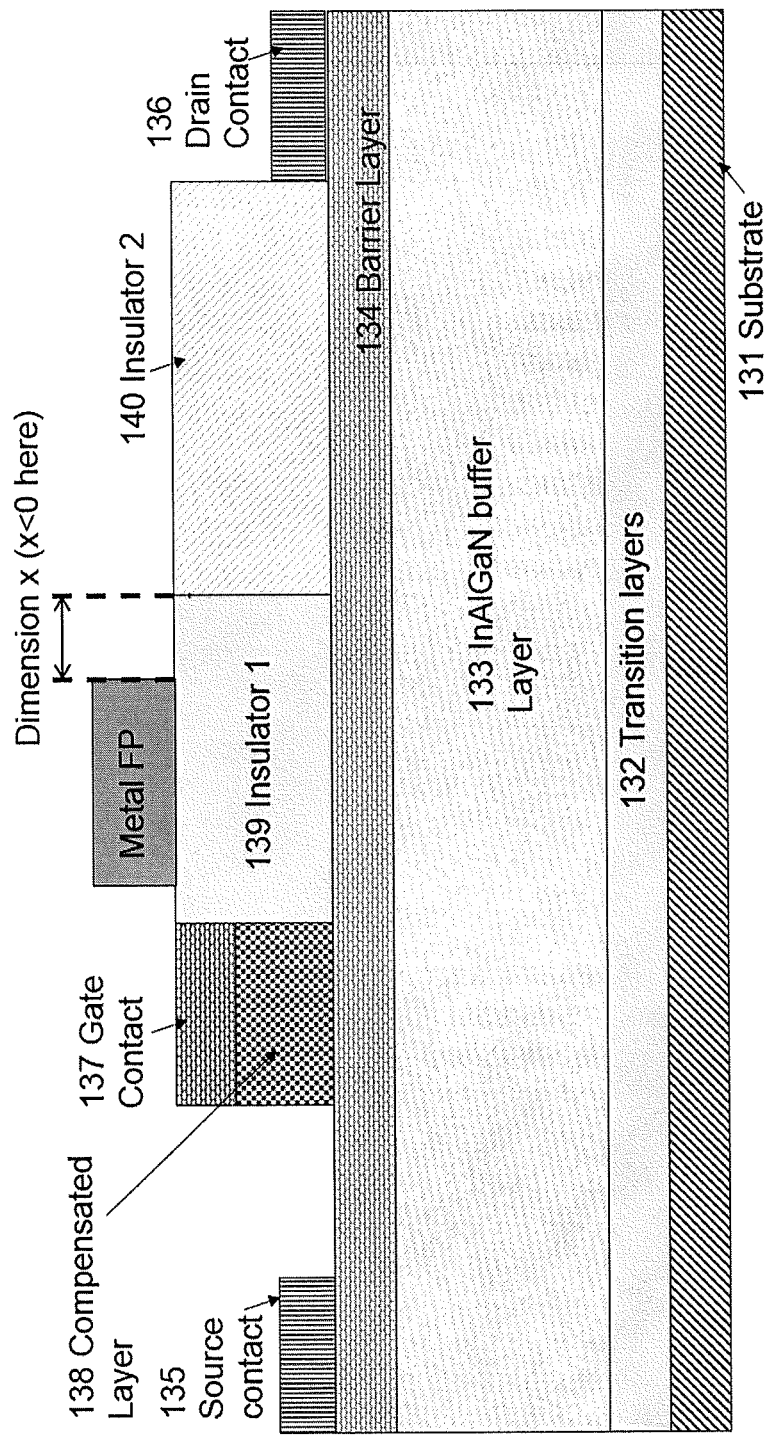
FIG. 21 illustrates a cross-sectional view of a GaN transistor formed according to an eighth embodiment of the present invention.

FIG. 21 illustrates a cross-sectional view of a GaN transistor formed according to an eighth embodiment of the present invention. In this embodiment, a metal field plate is included above the first insulator. The relative location of the metal field plate to the insulator 1/insulator 2 boundary, is shown as dimension x. The dimension of x is from −1 um to +0.5 um. Negative x means the metal field plate is away from the boundary by x and has no overlap with insulator 2. Positive x means the metal field plate is above the insulator 2 and covers by a length of x.

Figure 22:
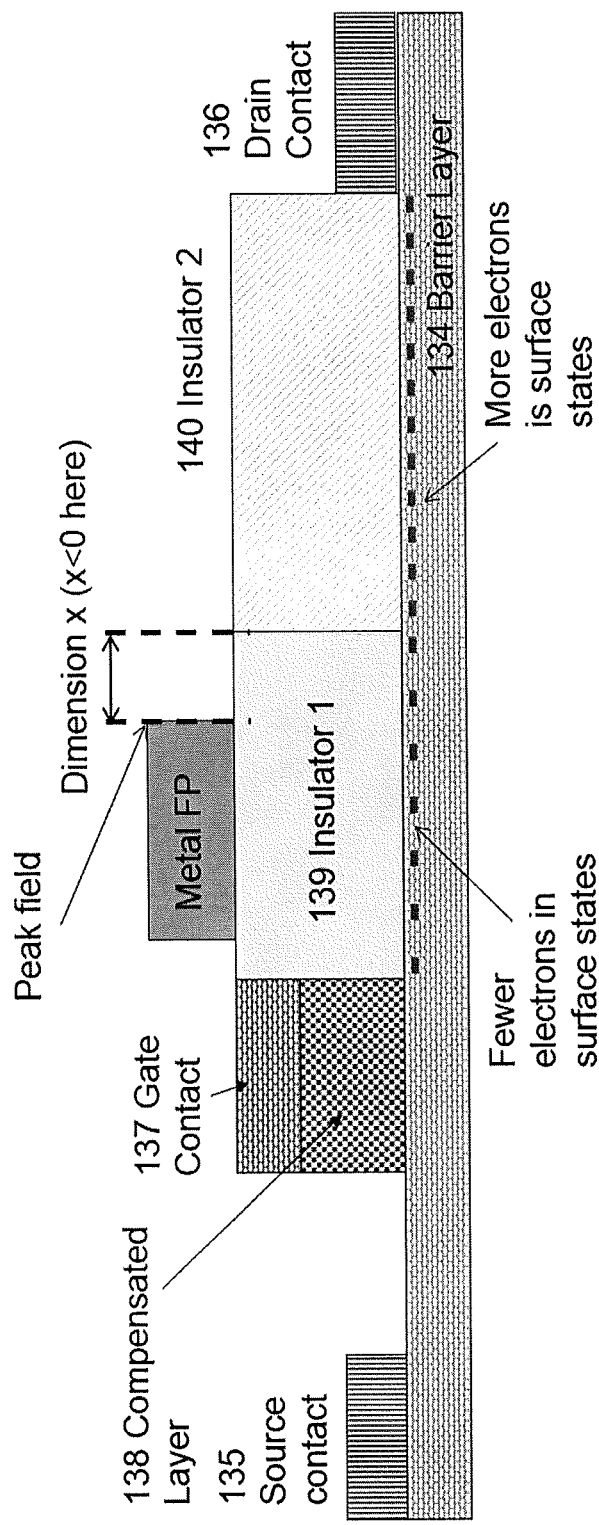
FIG. 22 illustrates a cross-sectional view of the GaN transistor formed according to the eighth embodiment of the present invention, which includes a depiction of electron quantities in surface states.

FIG. 22 illustrates a cross-sectional view of the GaN transistor formed according to the eighth embodiment of the present invention, and includes a depiction of electron quantities in surface states. As shown in the FIG. 22, x is better with negative value for lower field at the metal field plate tip, such as −0.5 μm. Since there are fewer electrons in surface states under insulator 1 than insulator 2, the depletion under insulator 1 is faster in the off-state. Therefore, the peak field at the tip of the metal field plate is lower with negative x.

Figure 23:
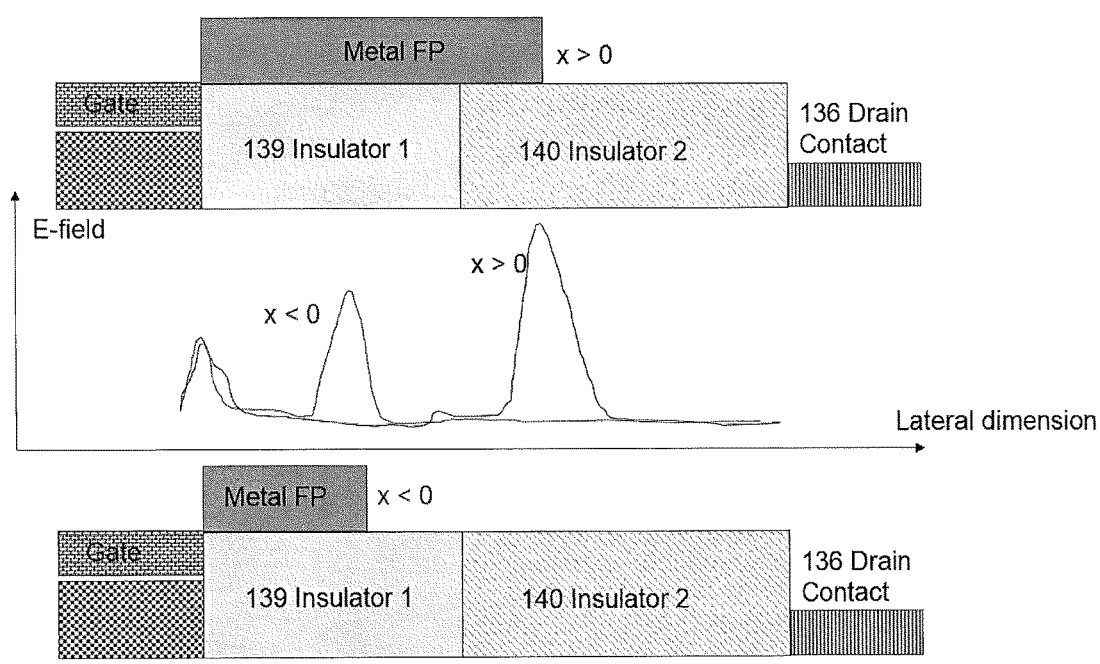
FIG. 23 is a plot of electromagnetic field for varying metal field plate lateral lengths for the GaN transistor formed according to the eighth embodiment of the present invention.

FIG. 23 is a plot of electromagnetic field for varying metal field plate lateral lengths for the GaN transistor formed according to the eighth embodiment of the present invention. As shown in the FIG. 23, x<0 has a lower peak field at the metal field plate edge than x>0. Therefore, the design with x<0 features more stable breakdown voltage in the off-state.

Figure 24:
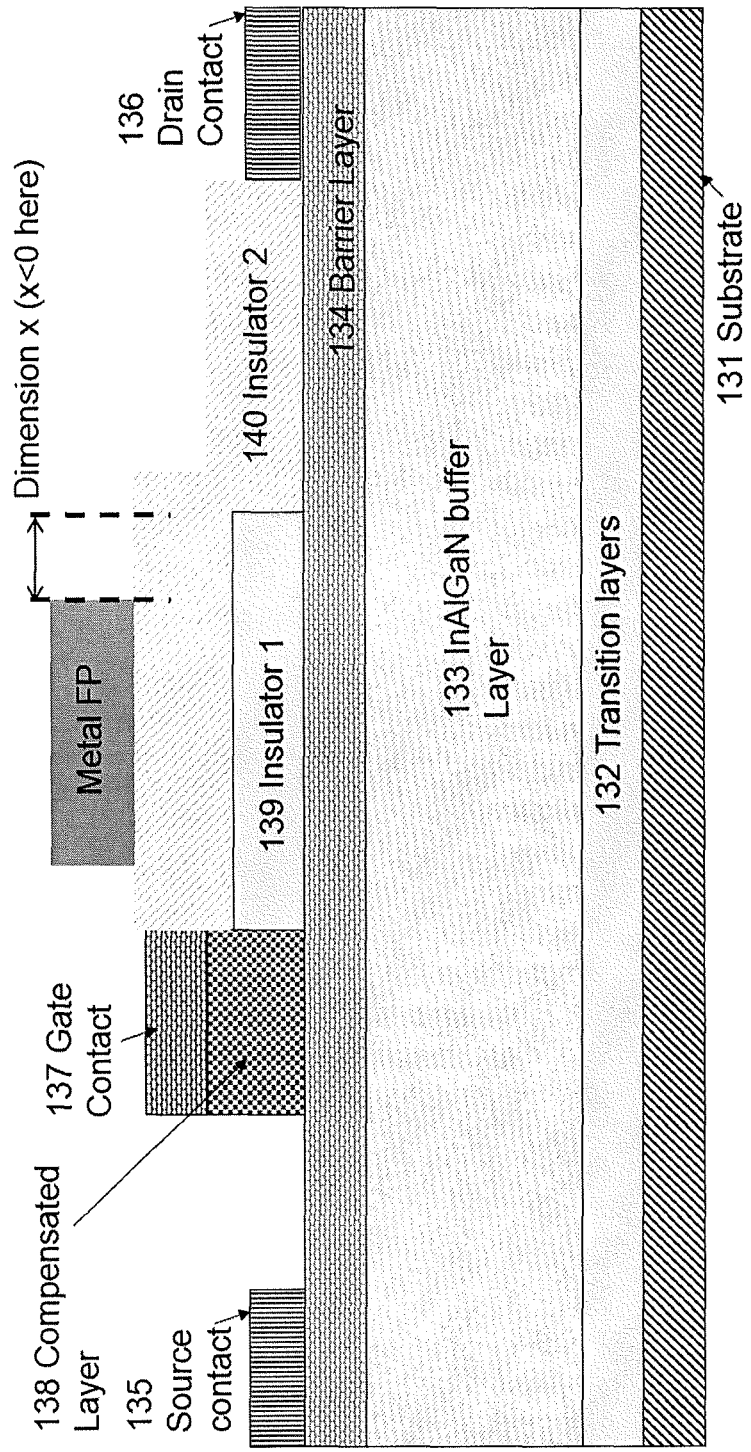
FIG. 24 illustrates a cross-sectional view of a GaN transistor formed according to a ninth embodiment of the present invention.

FIG. 24 illustrates a cross-sectional view of a GaN transistor formed according to a ninth embodiment of the present invention. The ninth embodiment nine is based on the eighth embodiment. It is more practical to have insulator 2 above insulator 1 in device fabrication. The dimension of x is typically from −1 μm to +0.5 μm. Negative x means the metal field plate is away from the boundary by x and has no overlap with insulator 2. Positive x means the metal field plate is above the insulator 2 and covers by a length of x.

Figure 25:
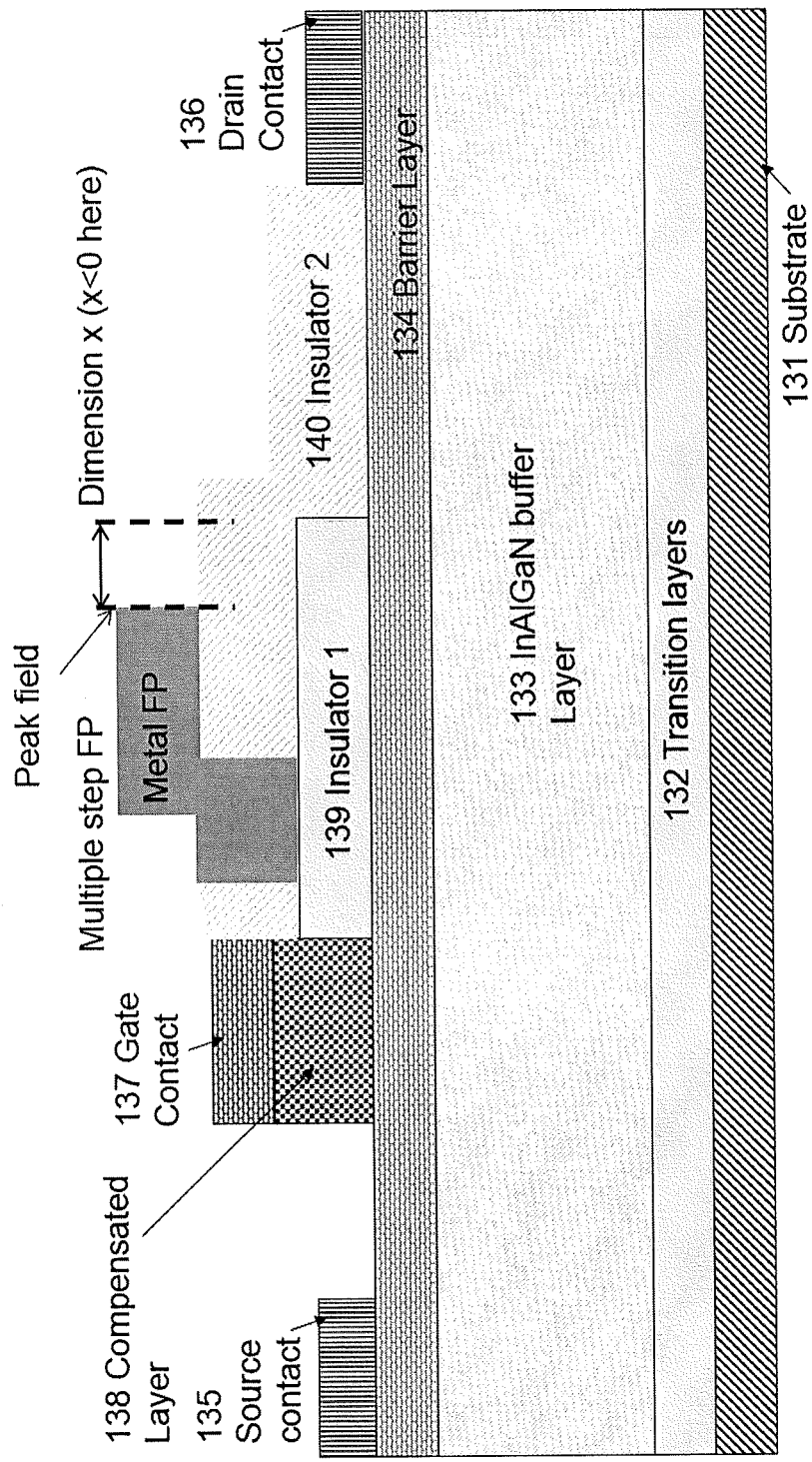
FIG. 25 illustrates a cross-sectional view of a GaN transistor formed according to a tenth embodiment of the present invention.

FIG. 25 illustrates a cross-sectional view of a GaN transistor formed according to a tenth embodiment of the present invention. The tenth embodiment ten is based on the ninth embodiment. Insulator 2 and insulator 1 under the metal field plate are partially etched away, which forms a multiple step metal field plate with varying heights. The design with the multiple step metal field plate further reduces the peak field at the metal field plate tip toward the drain. The dimension of x is from −1 μm to +0.5 μm.

Figure 26:
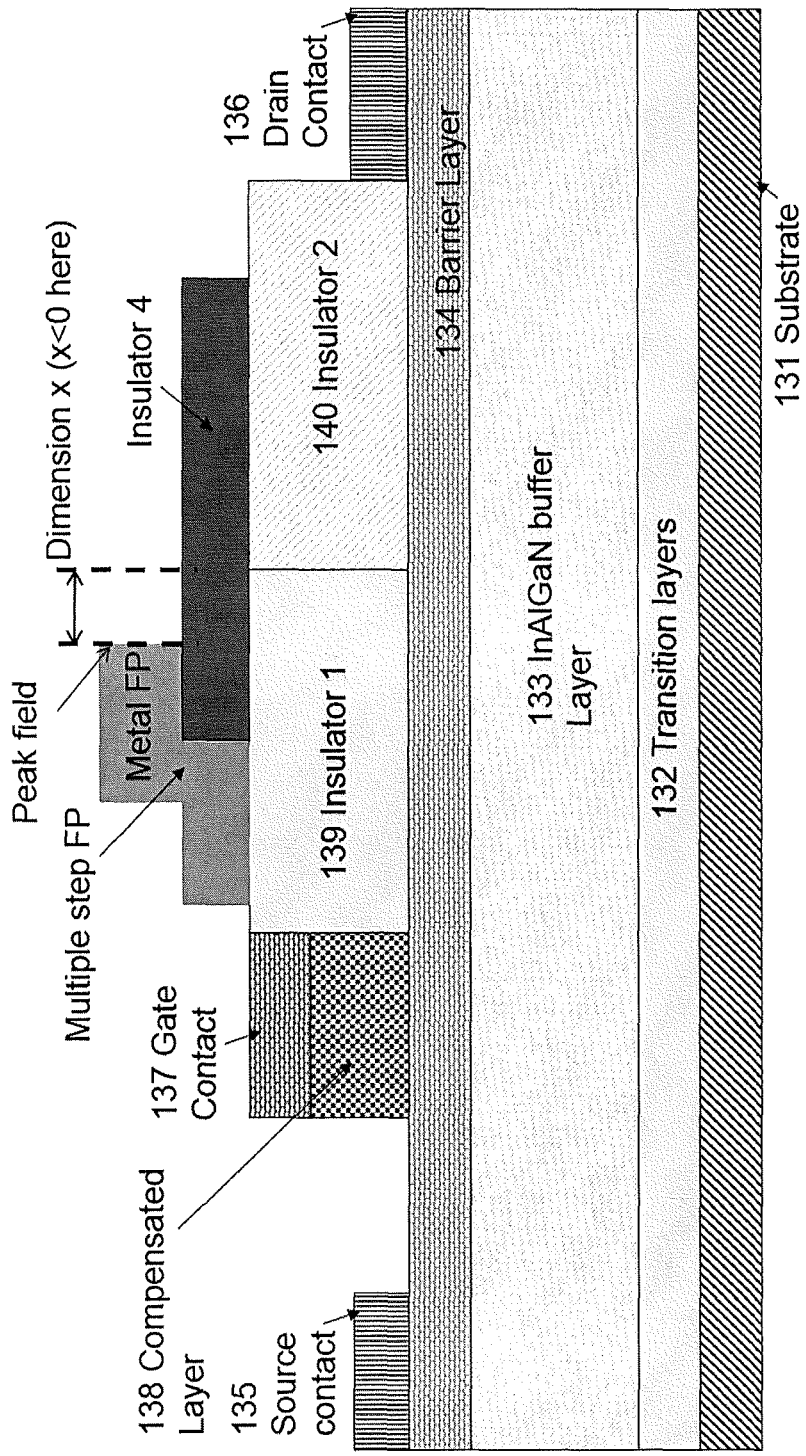
FIG. 26 illustrates a cross-sectional view of a GaN transistor formed according to an eleventh embodiment of the present invention.

FIG. 26 illustrates a cross-sectional view of a GaN transistor formed according to an eleventh embodiment of the present invention. Insulator 4 is positioned above insulator 1 and/or insulator 2, which forms a multiple step metal field plate. The design with the multiple step metal field plate could further reduce the peak field at the metal field plate tip toward the drain. The dimension of x is from −1 μm to +0.5 μm. Again, negative x means the metal field plate is away from the boundary by x and has no overlap with insulator 2. Positive x means the metal field plate is above the insulator 2 and covers by a length of x.

Figure 27:
FIG. 27-50 illustrate additional variations and details of the previously described embodiments of the present invention.

FIGS. 27-31 illustrate additional variations and details of the previously described embodiments of the present invention. FIG. 27 shows the transistor an additional third insulator (ILD3) and fourth insulator (ILD4) between the second insulator (ILD2) and the drain (D). ILD2, ILD3, ILD4 . . . may contain an insulator offset layer and a dielectric film, where the insulator offset layer enhances barrier height and increases 2DEG density.

Figure 28:

FIG. 28 shows that the 2DEG density increases under ILD1 to ILD2 to ILD3, and so on.

Figure 29:

FIG. 29 shows the previously described embodiment with metal field spacing.

Figure 30:
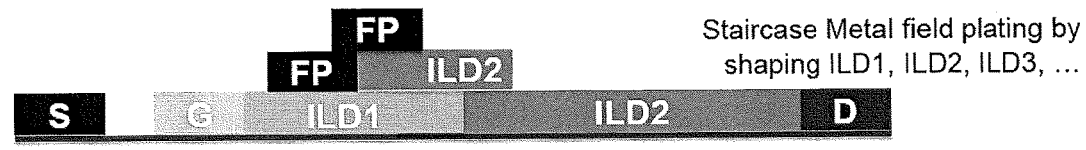
Figure 31:
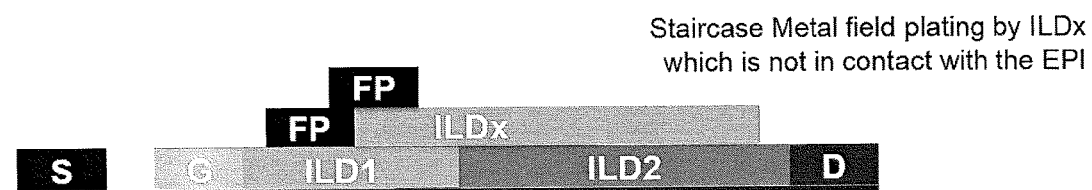

FIG. 30 shows the previously described staircase metal field plating by shaping ILD1, ILD2, ILD3, etc. FIG. 31 shows staircase-type (multi-stepped) metal field plating by ILDx which is not in contact with the EPI layer.

Figure 32:
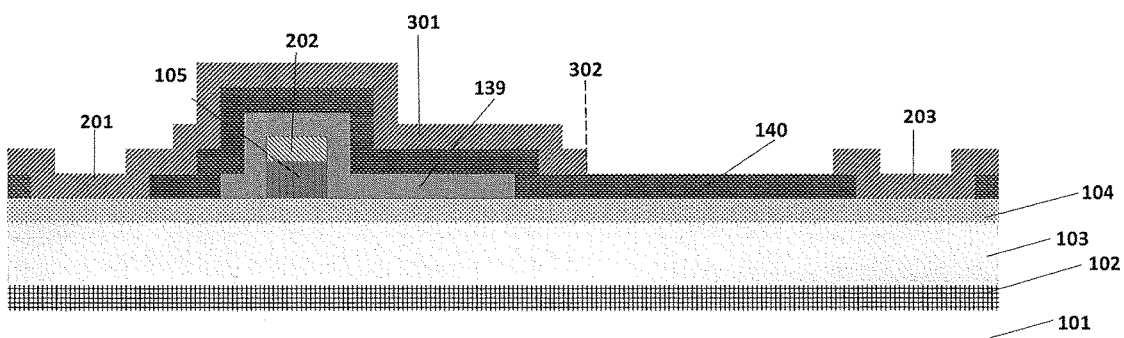

FIG. 32 illustrates a cross-sectional view of a GaN transistor formed according to the second embodiment of the present invention. The transistor of this embodiment comprises the following components:

101 is the substrate
102 is the transition layer
103 is the un-doped GaN buffer layer, typically 0.5 to 10 um thick
104 is un-doped AlGaN barrier layer, typically 50 A to 300 A thick with Al % from 12% to 28%
105 is the compensated semiconductor layer 139 is insulator 1
140 is insulator 2
201 is the source contact
202 is the gate contact
203 is the drain contact
301 is the metal above barrier 104, which serves as the metal field plate
302 is the drain side edge of metal 301, which is above the barrier/insulator 2 interface Note: source 201 and metal 301 are connected in this structure. Alternatively, they could be separated.

Process sequence: insulator 1→(then) insulator 2 (i.e., insulator 1 is formed first, then insulator 2).

Figure 33:
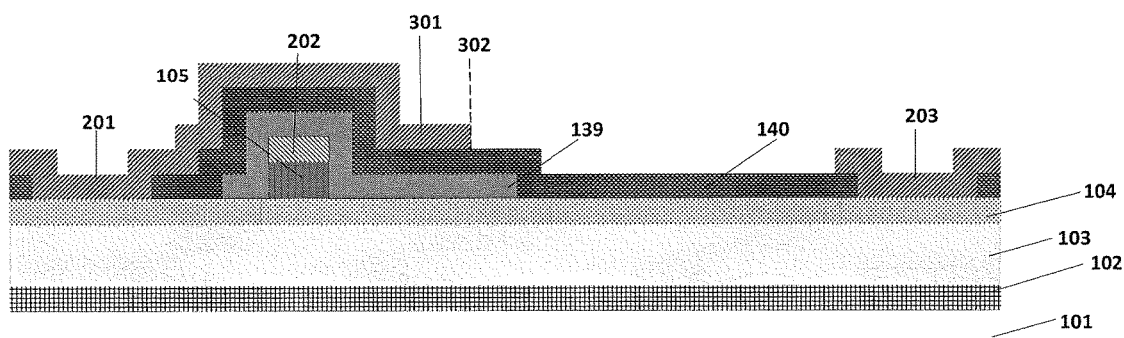

FIG. 33 illustrates a cross-sectional view of a GaN transistor formed according to the second embodiment described above, but with a laterally shortened field plate. Compared to the second embodiment of FIG. 32, the peak field at 302 is reduced due to faster depletion at barrier/insulator 1 interface which creates wider depletion width.

Figure 34:
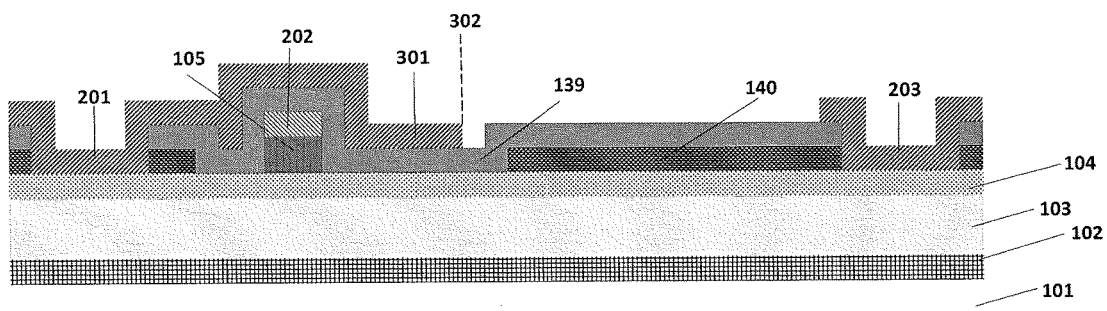

FIG. 34 illustrates a cross-sectional view of a GaN transistor formed according to the second embodiment described above, but second insulator 140 does not extend laterally over the gate such that, compared to FIGS. 32 and 33, only the first insulator 139 is between metal 301 and barrier layer 104, resulting in a thinner dielectric layer and better field-plating effect.

Figure 35:
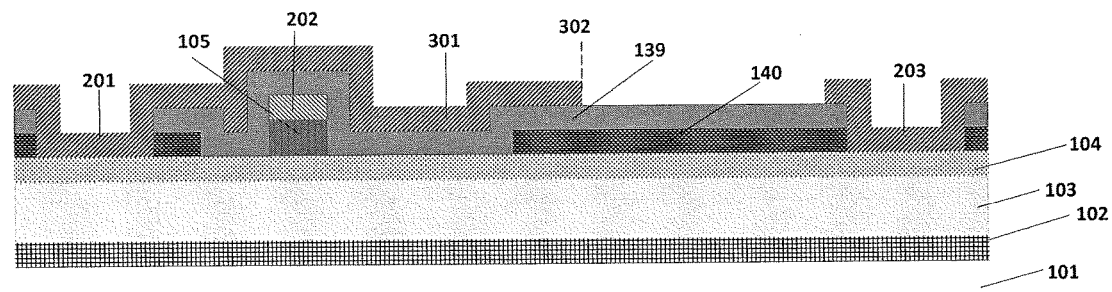

FIG. 35 illustrates a cross-sectional view of a GaN transistor which is similar to FIG. 34, but the field plate metal 301 extends laterally over the second insulator 140. As in FIG. 34, only the first insulator 139 is between metal 301 and barrier layer 104, resulting in a thinner dielectric layer and better field-plating effect.

Figure 36:
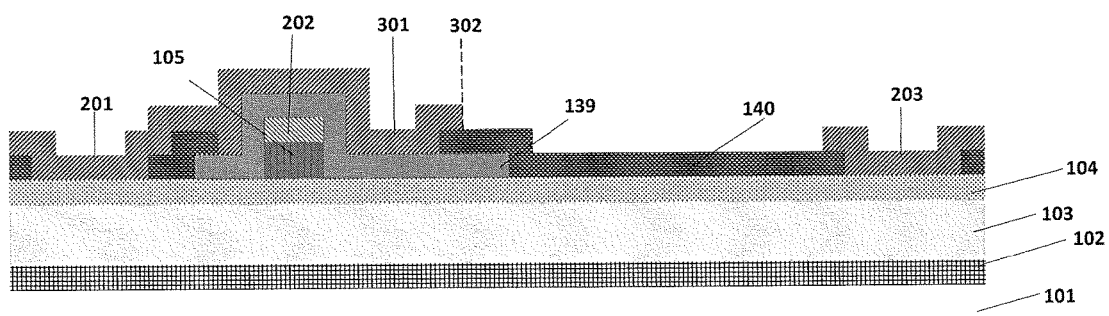

FIG. 36 illustrates a cross-sectional view of a GaN transistor which is similar to the previously described structures, but results in a better field-plating effect by etching away the second insulator 140 near the gate.

Figure 37:
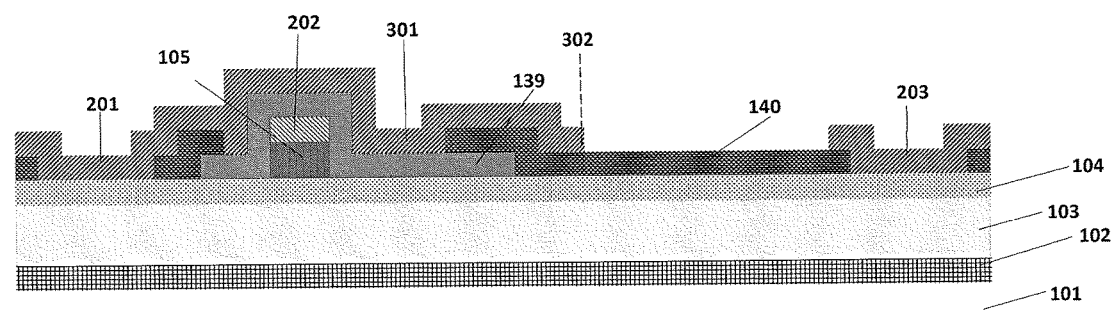

FIG. 37 illustrates a cross-sectional view of a GaN transistor which is similar to FIG. 36, but the field plate metal 301 extends laterally over the second insulator 140. Source 201 and metal 301 are connected in this structure, but, alternatively, they could be separated.

Figure 38:
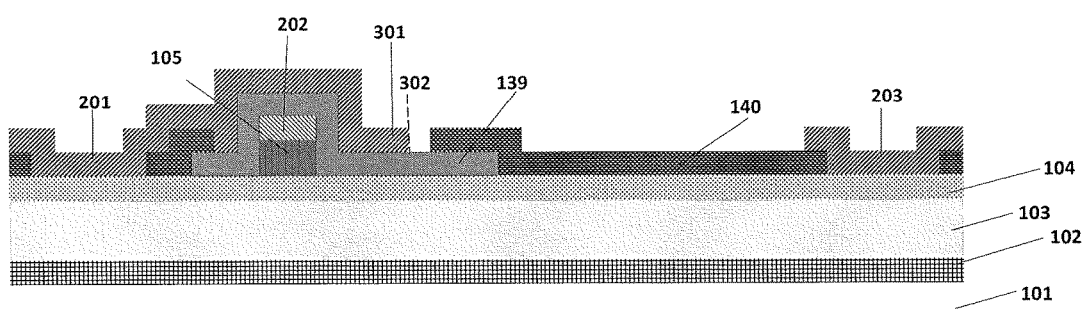

FIG. 38 illustrates a cross-sectional view of a GaN transistor similar to FIG. 34, better field-plating effect by etching away insulator 2 near the gate.

Figure 39:
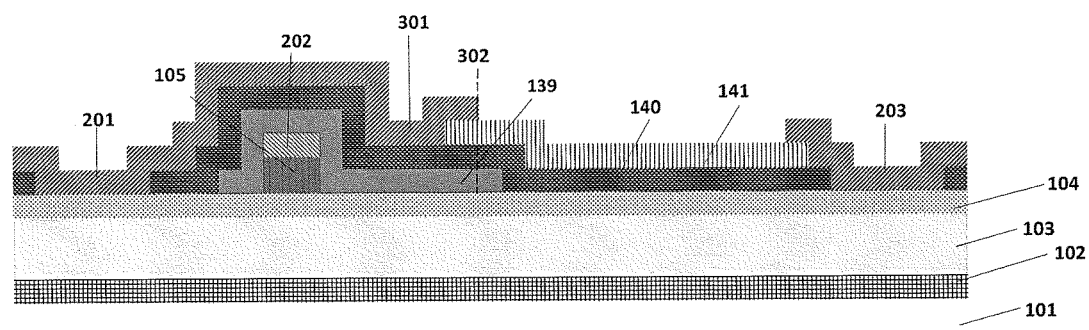

FIG. 39 illustrates a cross-sectional view of a GaN transistor similar to the previously described embodiments, but with multiple field-plating (and a third insulator 141) to obtain more uniform lateral field distribution between gate 202 and drain 203.

Figure 40:
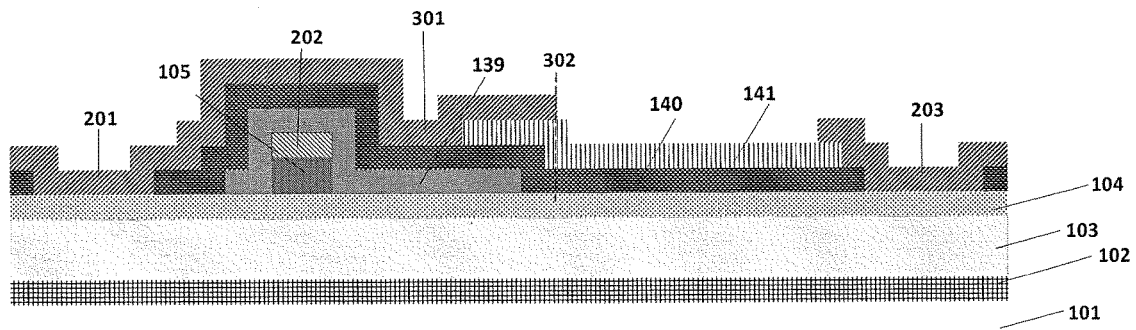

FIG. 40 illustrates a cross-sectional view of a GaN transistor with multiple field-plate similar to FIG. 39, but the field plate 301 extends laterally further over third insulator 141.

Figure 41:
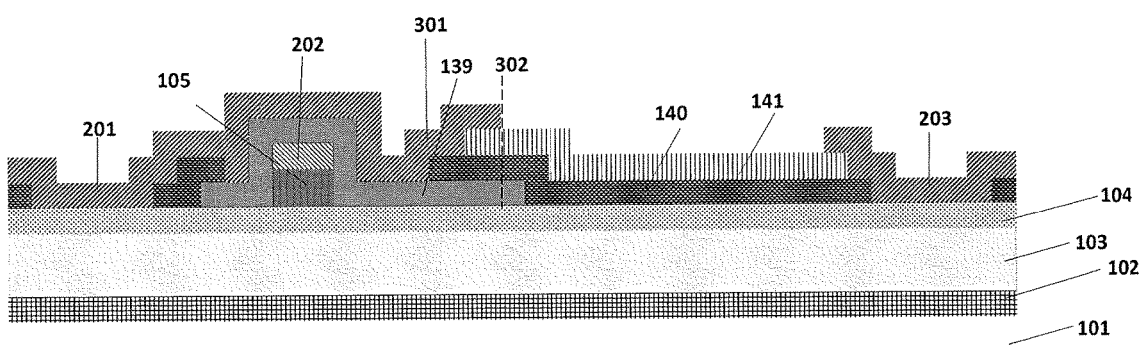

FIG. 41 illustrates a cross-sectional view of a GaN transistor similar to FIG. 39 with multiple field-plating to obtain more uniform lateral field distribution between gate 202 and drain 203, but with insulator 2 etched away near the gate to enhance the field-plating effect.

Figure 42:
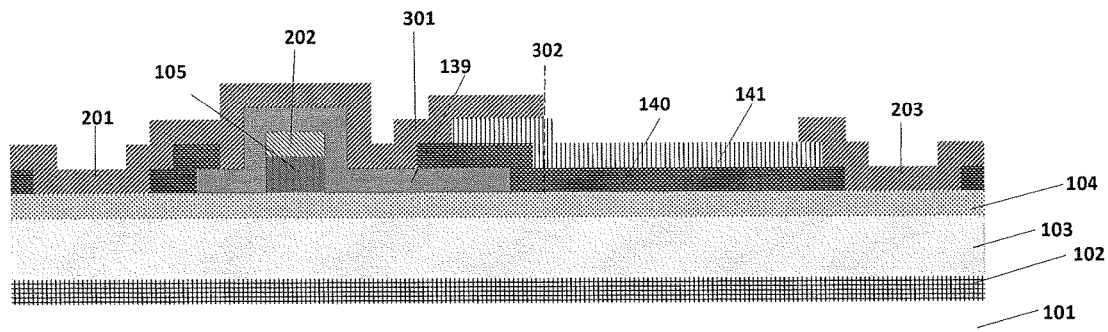

FIG. 42 illustrates a cross-sectional view of a GaN transistor similar to FIG. 40 with multiple field-plating to obtain more uniform lateral field distribution between gate 202 and drain 203, but with insulator 2 etched away near the gate to enhance the field-plating effect.

Figure 43:
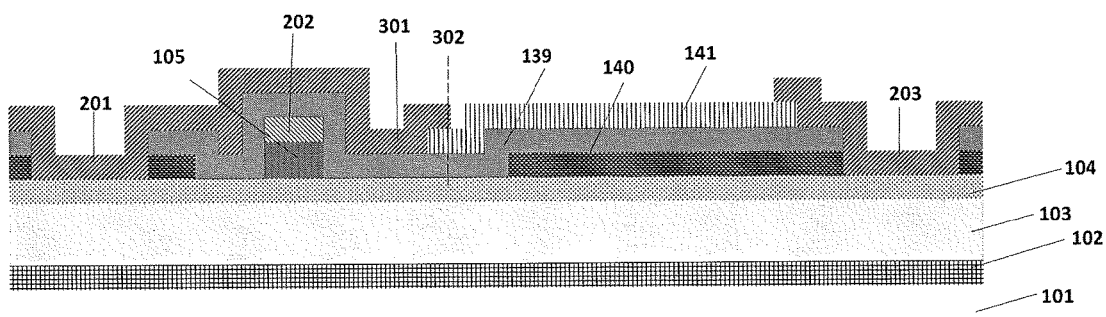

FIG. 43 illustrates a cross-sectional view of a GaN transistor similar to FIG. 42 with multiple field-plating to obtain more uniform lateral field distribution between gate 202 and drain 203, but, as in FIG. 40, the field plate 301 extends laterally further over third insulator 141.

Figure 44:
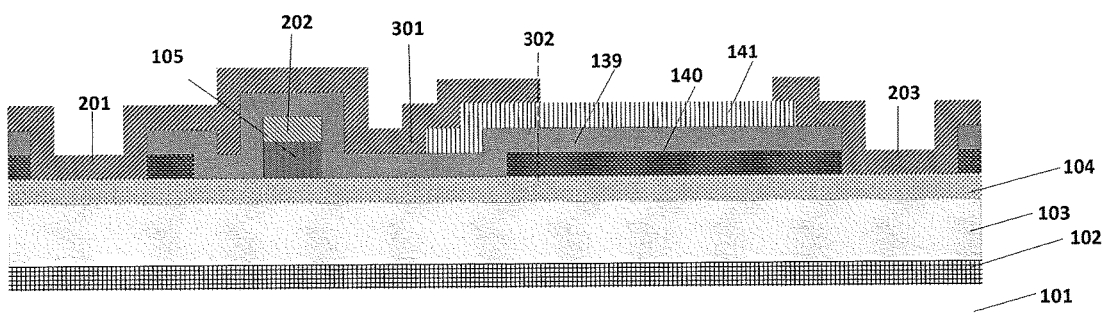

FIG. 44 illustrates a cross-sectional view of a GaN transistor similar to FIG. 42, but with a stepped field plate on the drain side, rather than the source side, of the gate.

Figure 45:
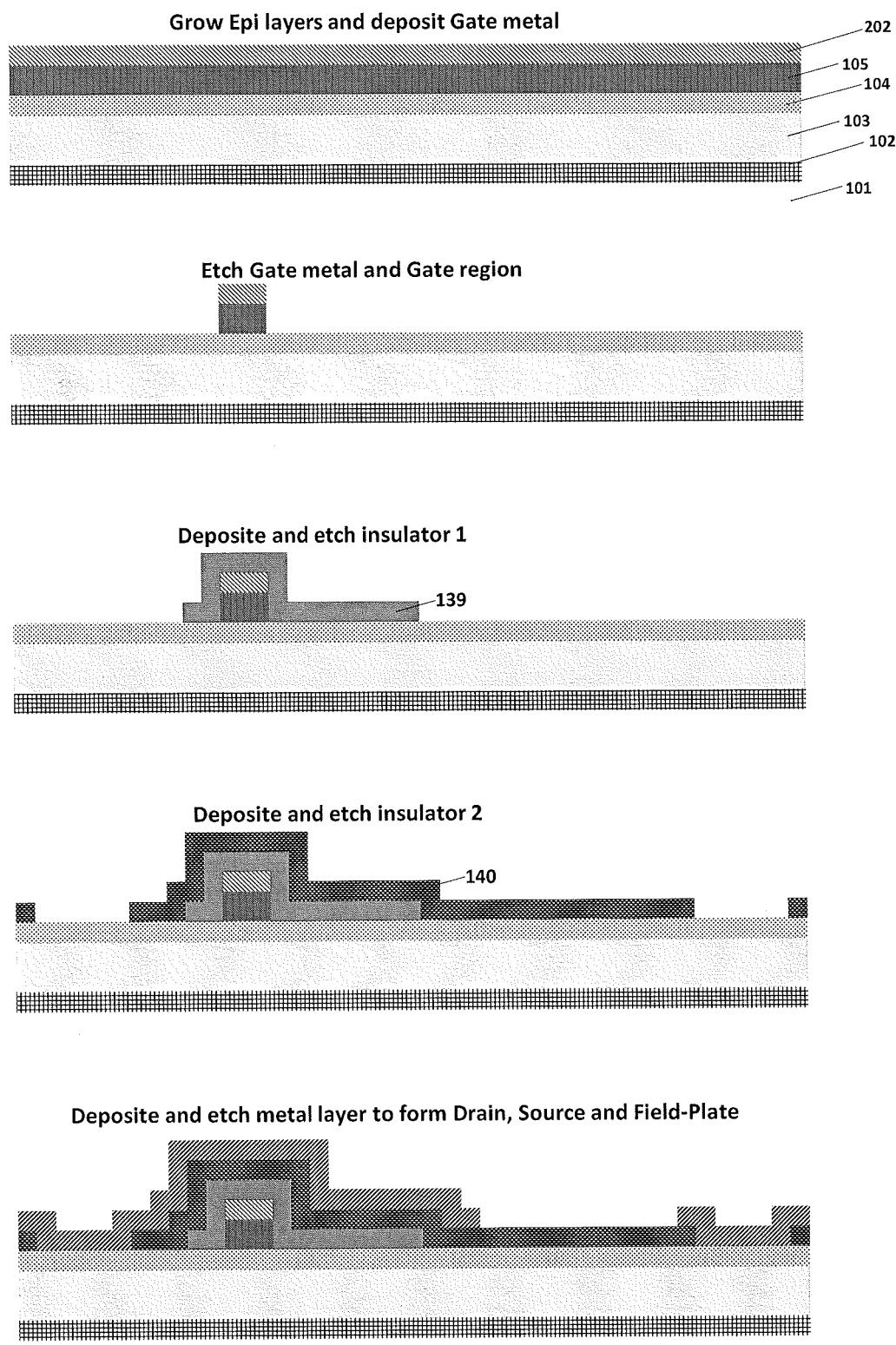

FIG. 45 illustrates an exemplary process flow for fabricating the GaN transistor of FIG. 32.

Figure 46:
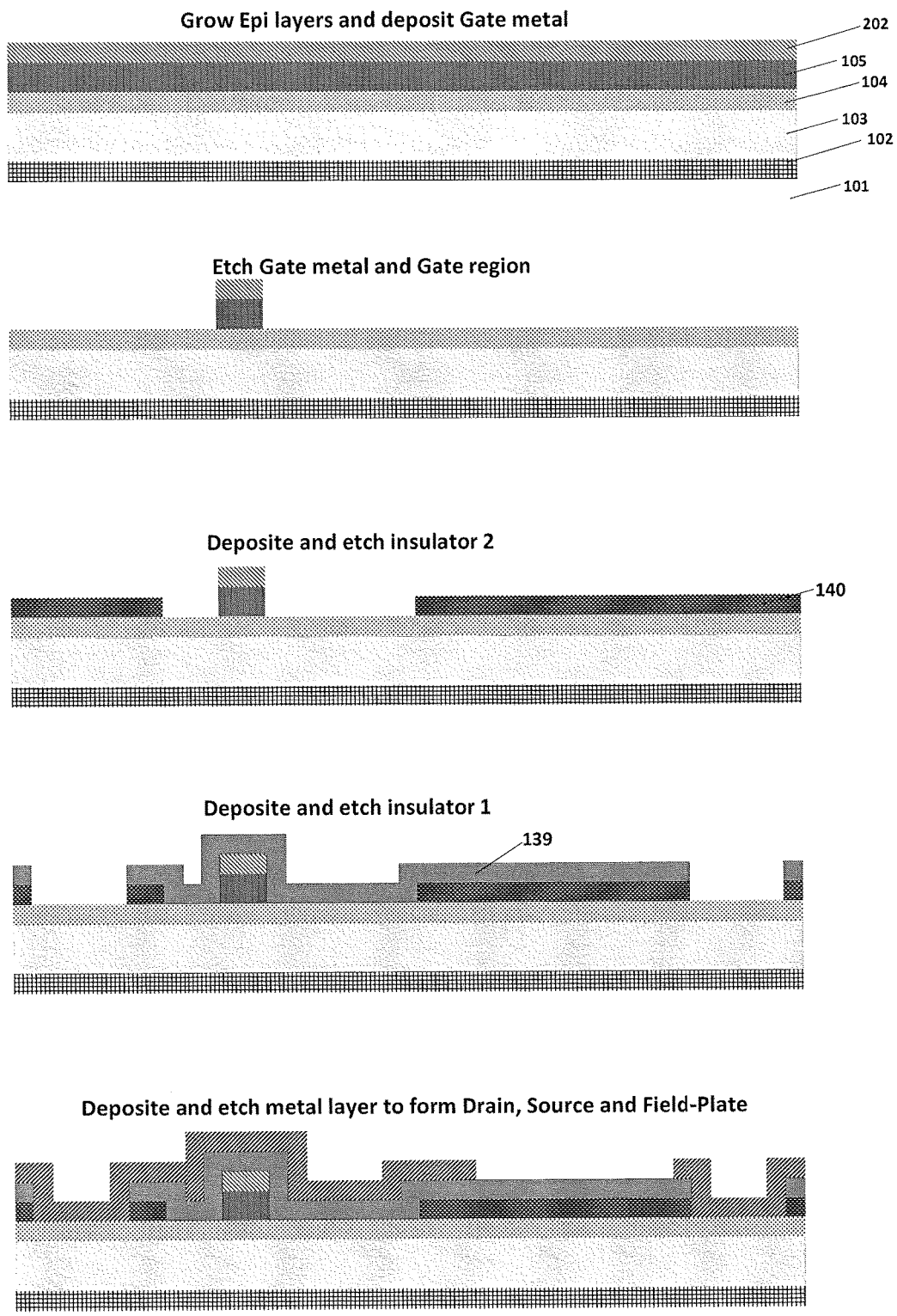

FIG. 46 illustrates an exemplary process flow for fabricating the GaN transistor of FIG. 35.

Figure 47:
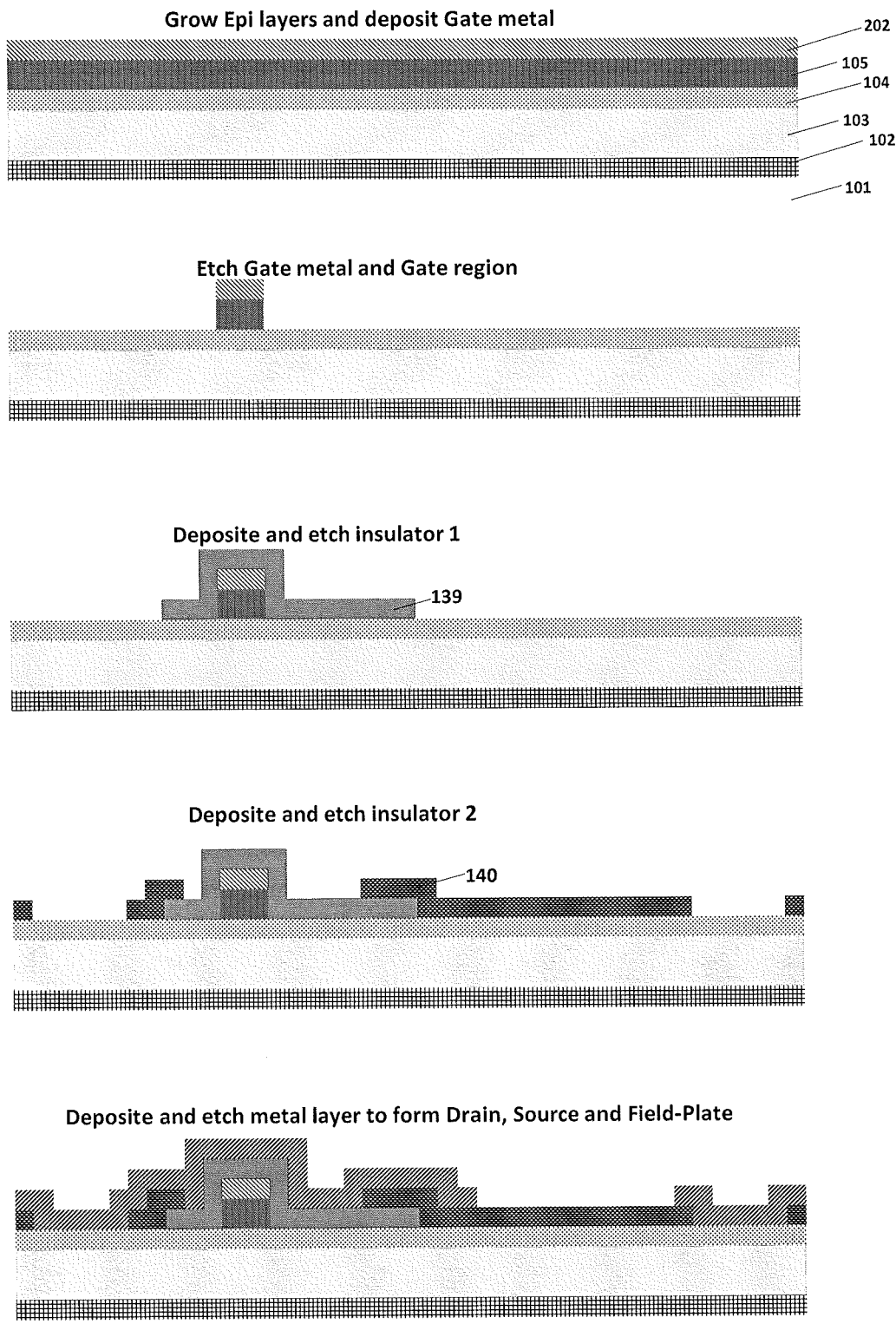

FIG. 47 illustrates an exemplary process flow for fabricating the GaN transistor of FIG. 37.

Figure 48:
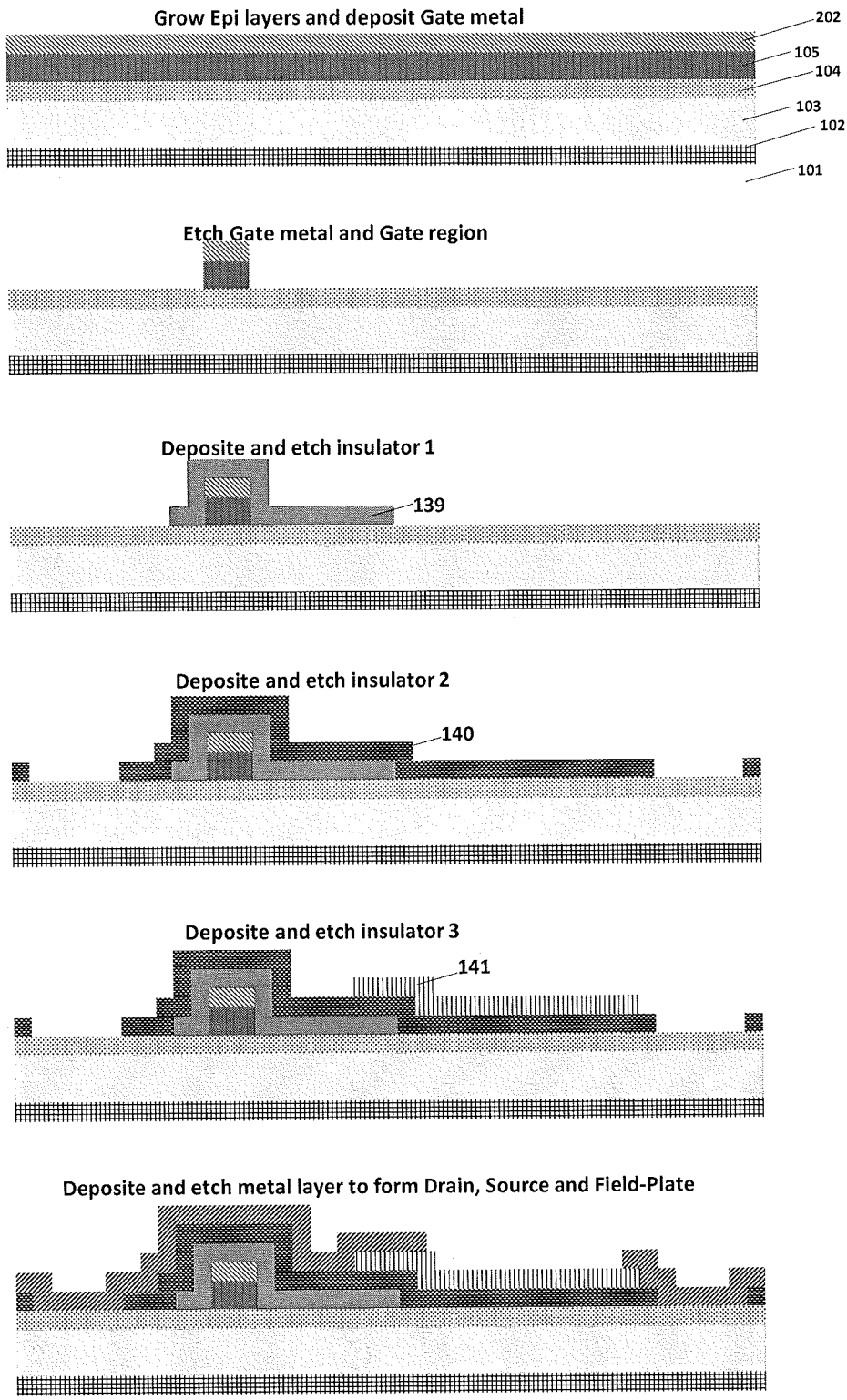

FIG. 48 illustrates an exemplary process flow for fabricating the GaN transistor of FIG. 40.

Figure 49:
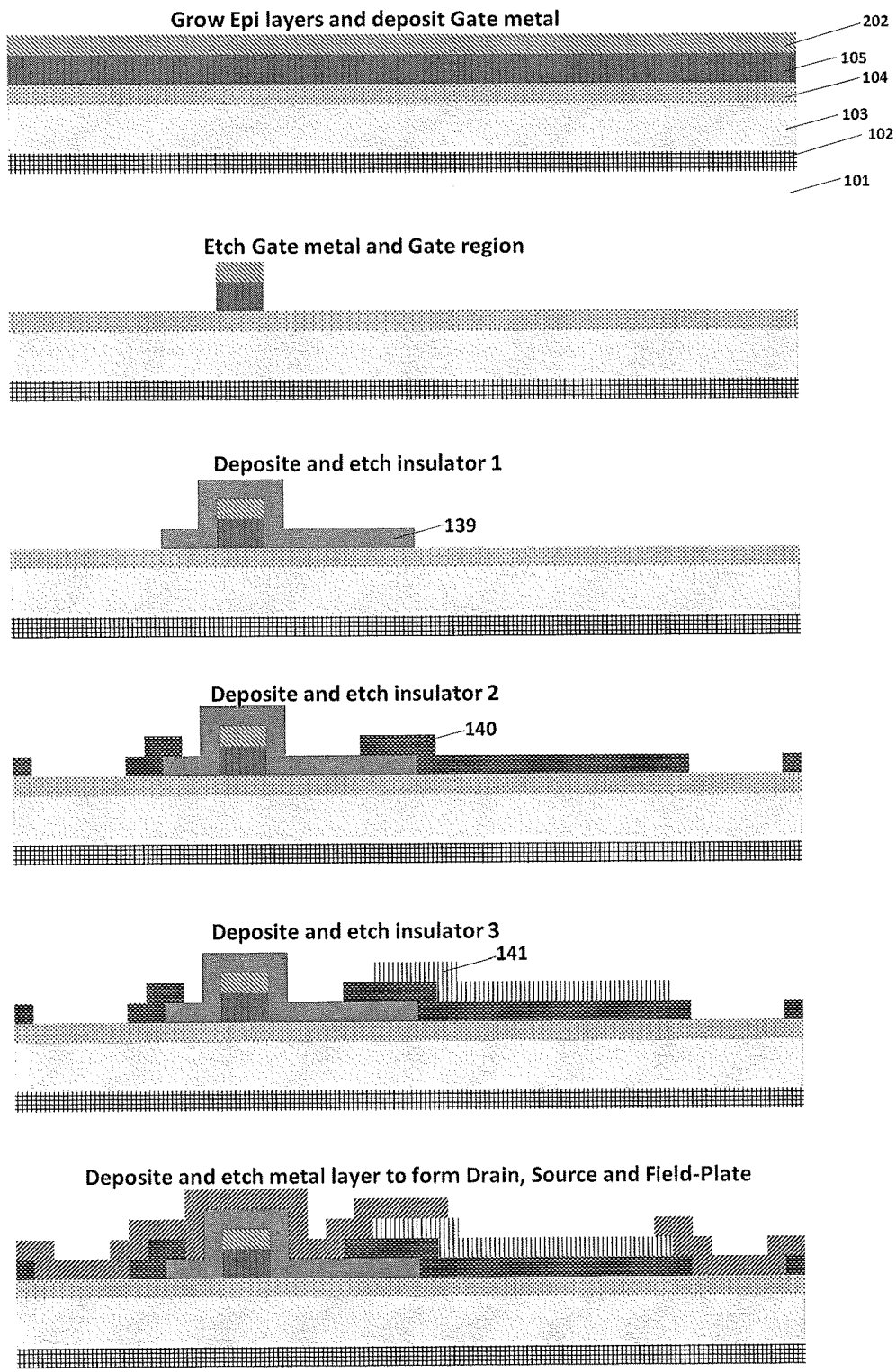

FIG. 49 illustrates an exemplary process flow for fabricating the GaN transistor of FIG. 42.

Figure 50:
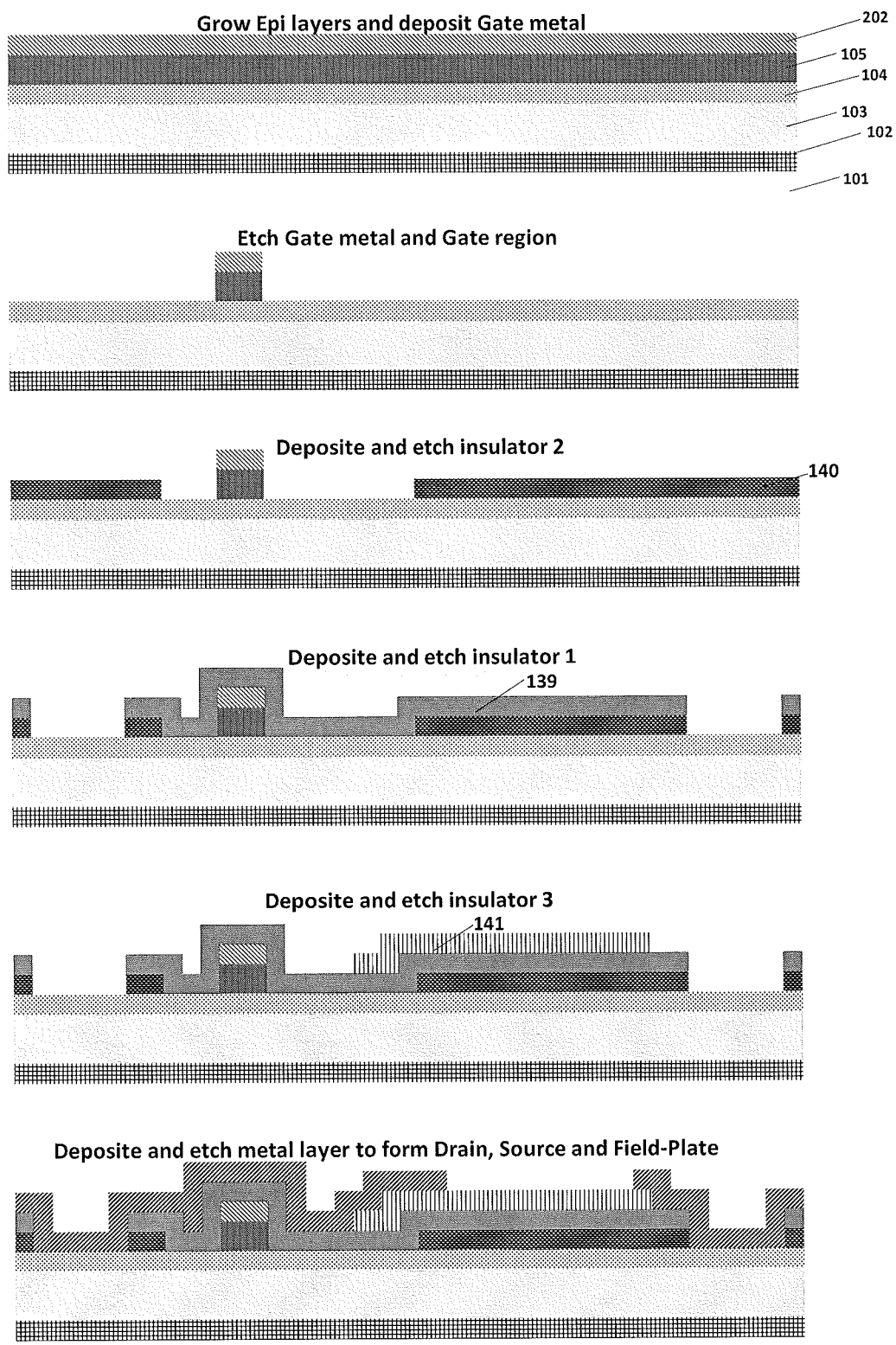

FIG. 50 illustrates an exemplary process flow for fabricating the GaN transistor of FIG. 44.

The method steps in any of the embodiments described herein are not restricted to being performed in any particular order. Also, structures mentioned in any of the method embodiments may utilize structures mentioned in any of the device embodiments. Such structures may be described in detail with respect to the device embodiments only but are applicable to any of the method embodiments.

Features in any of the embodiments described in this disclosure may be employed in combination with features in other embodiments described herein, such combinations are considered to be within the spirit and scope of the present invention.

The contemplated modifications and variations specifically mentioned in this disclosure are considered to be within the spirit and scope of the present invention.

The above description and drawings are only to be considered illustrative of specific embodiments, which achieve the features and advantages described herein. Modifications and substitutions to specific process conditions may be made. Accordingly, the embodiments of the invention are not considered as being limited by the foregoing description and drawings.

More generally, even though the present disclosure and exemplary embodiments are described above with reference to the examples according to the accompanying drawings, it is to be understood that they are not restricted thereto. Rather, it is apparent to those skilled in the art that the disclosed embodiments can be modified in many ways without departing from the scope of the disclosure herein. Moreover, the terms and descriptions used herein are set forth by way of illustration only and are not meant as limitations. Those skilled in the art will recognize that many variations are possible within the spirit and scope of the disclosure as defined in the following claims, and their equivalents, in which all terms are to be understood in their broadest possible sense unless otherwise indicated.

The invention claimed is:

1. A column III nitride transistor comprising:
a substrate;
a transition layer positioned above the substrate, wherein the transition layer comprises a column III nitride material;
a buffer layer positioned above the transition layer, wherein the buffer layer comprises a column III nitride material;
a barrier layer positioned immediately above the buffer layer, wherein the barrier layer comprises a column III nitride material;

a channel comprising a conductive two-dimensional electron gas (2DEG) formed in the buffer layer at the junction with the barrier layer;

gate, drain, and source contacts positioned above the barrier layer, wherein the gate contact is positioned between the source and drain contacts; and a first insulator and a second insulator positioned above the barrier layer and at least between the gate and drain contacts, wherein the first insulator is nearer to the gate contact than the second insulator, and wherein at least a part of the first insulator is positioned lateral to at least a part of the second insulator;

wherein net electron donor density above the channel under the first insulator is lower than net electron donor density above the channel under the second insulator, such that 2DEG density in the channel under the second insulator is higher than 2DEG density in the channel under the first insulator.

2. The transistor of claim 1, wherein the first insulator has fewer electrons in surface states than the second insulator.

3. The transistor of claim 1, wherein the column III nitride material comprising the buffer layer and/or the barrier layer comprises a GaN material.

4. The transistor of claim 2, wherein the barrier layer comprises $In_xAl_yGa_{(1-x-y)}N$, where $x+y \leq 1$.

5. The transistor of claim 1, further comprising a metal field plate positioned above at least one of the first insulator and the second insulator.

6. The transistor of claim 1, further comprising a metal field plate positioned above the first insulator and at least between the gate and drain contacts, and not above the second insulator.

7. The transistor of claim 1, further comprising a metal field plate positioned above the first insulator and the second insulator and at least between the gate and drain contacts.

8. The transistor of claim 1, further comprising a metal field plate positioned above at least one of the first insulator and the second insulator and at least between the gate and drain contacts, wherein the metal field plate positioned between the gate and drain contacts comprises multiple steps with varying heights.

9. The transistor of claim 1, wherein the second insulator is further positioned above an entirety of the first insulator.

10. The transistor of claim 1, wherein the second insulator is further positioned above only a portion of the first insulator.

11. The transistor of claim 1, wherein the first insulator is further positioned above an entirety of the second insulator.

12. The transistor of claim 1, wherein the first insulator is further positioned above only a portion of the second insulator.

13. The transistor of claim 1, further comprising a third insulator positioned above the second insulator and at least between the gate and drain contacts.

14. The transistor of claim 13, wherein the third insulator is further positioned above the first insulator.

15. The transistor of claim 13, further comprising a metal field plate positioned above the first insulator and the third insulator and at least between the gate and drain contacts, and not above the second insulator.

16. The transistor of claim 13, further comprising a metal field plate positioned above the first insulator, second insulator, and third insulator, and at least between the gate and drain contacts.

17. The transistor of claim 1, wherein at least a portion of the first insulator is positioned between the gate contact and the second insulator.

18. The transistor of claim 1, wherein the first insulator and the second insulator are each positioned immediately above the barrier layer.

19. A column III nitride transistor comprising:

a substrate;

a transition layer positioned above the substrate, wherein the transition layer comprises a column III nitride material;

a buffer layer positioned above the transition layer, wherein the buffer layer comprises a column III nitride material;

a barrier layer positioned immediately above the buffer layer, wherein the barrier layer comprises a column III nitride material;

a channel comprising a conductive two-dimensional electron gas (2DEG) formed in the buffer layer at the junction with the barrier layer;

gate, drain, and source contacts positioned above the barrier layer, wherein the gate contact is positioned between the source and drain contacts;

a first insulator and a second insulator positioned above the barrier layer and at least between the gate and drain contacts, wherein the first insulator is nearer to the gate contact than the second insulator; and an insulator offset layer positioned at least between the second insulator and the barrier layer;

wherein net electron donor density above the channel under the first insulator is lower than net electron donor density above the channel under the second insulator, such that 2DEG density in the channel under the second insulator is higher than 2DEG density in the channel under the first insulator.

20. The transistor of claim 19, wherein the insulator offset layer comprises a column III nitride material.

21. The transistor of claim 20, wherein the column III nitride material comprising the insulator offset layer comprises one or more of AlN, AlGaN, and GaN materials.

22. The transistor of claim 20, wherein the column III nitride material comprising the insulator offset layer is doped.

23. The transistor of claim 19, wherein the drain contact is in contact with the barrier layer through a removed portion of the insulator offset layer.

24. The transistor of claim 19, wherein the insulator offset layer is further positioned between the drain contact and the barrier layer.

* * * * *